United States Patent
Yasunaga et al.

(10) Patent No.: US 7,392,179 B2
(45) Date of Patent: Jun. 24, 2008

(54) LPC VECTOR QUANTIZATION APPARATUS

(75) Inventors: Kazutoshi Yasunaga, Kyoto (JP);
Toshiyuki Morii, Kawasaki (JP);
Hiroyuki Ehara, Yokohama (JP);
Kazunori Mano, Musashino (JP);
Yusuke Hiwasaki, Musashino (JP)

(73) Assignees: Matsushita Electric Industrial Co., Ltd., Osaka (JP); Nippon Telegraph and Telephone Corporation, Tokyo (JP)

( * ) Notice: Subject to any disclaimer, the term of this patent is extended or adjusted under 35 U.S.C. 154(b) by 957 days.

(21) Appl. No.: 10/416,532

(22) PCT Filed: Nov. 29, 2001

(86) PCT No.: PCT/JP01/10425

§ 371 (c)(1),
(2), (4) Date: May 27, 2003

(87) PCT Pub. No.: WO02/45077

PCT Pub. Date: Jun. 6, 2002

(65) Prior Publication Data

US 2004/0015346 A1    Jan. 22, 2004

(30) Foreign Application Priority Data

Nov. 30, 2000  (JP) .............................. 2000-366191

(51) Int. Cl.
*G10L 19/12* (2006.01)

(52) U.S. Cl. ........................ 704/222; 704/219

(58) Field of Classification Search ........................ None
See application file for complete search history.

(56) References Cited

U.S. PATENT DOCUMENTS

| | | | |
|---|---|---|---|
| 5,495,555 A | | 2/1996 | Swaminathan |
| 5,596,676 A | | 1/1997 | Swaminathan et al. |
| 5,651,026 A | | 7/1997 | Lin et al. |
| 5,664,055 A | * | 9/1997 | Kroon ......................... 704/223 |
| 5,675,702 A | * | 10/1997 | Gerson et al. ............... 704/223 |
| 5,677,986 A | | 10/1997 | Amada et al. |
| 5,732,389 A | * | 3/1998 | Kroon et al. ................. 704/223 |
| 5,734,789 A | | 3/1998 | Swaminathan et al. |
| 5,774,840 A | * | 6/1998 | Taumi et al. ................. 704/223 |
| 5,819,213 A | | 10/1998 | Oshikiri et al. |
| 6,104,992 A | * | 8/2000 | Gao et al. .................... 704/220 |

(Continued)

FOREIGN PATENT DOCUMENTS

EP                684702           11/1995

(Continued)

OTHER PUBLICATIONS

English Language Abstract of JP 61-252600.

(Continued)

*Primary Examiner*—David D. Knepper
(74) *Attorney, Agent, or Firm*—Greenblum & Bernstein, P.L.C.

(57) ABSTRACT

The present invention carries out pre-selection on many LPC codevectors stored in an LSF codebook 101 using a weighted Euclidean distortion as a measure and carries out a full-code selection on the LPC codevectors left after the pre-selection using an amount of distortion in a spectral space as a measure. This makes it possible to improve the quantization performance of the LPC parameter vector quantizer and improve the quality of synthesized speech of the speech coder/decoder.

22 Claims, 9 Drawing Sheets

U.S. PATENT DOCUMENTS

| | | | |
|---|---|---|---|
| 6,134,520 | A | 10/2000 | Ravishankar et al. |
| 6,269,333 | B1 | 7/2001 | Ravishankar |
| 6,389,389 | B1 * | 5/2002 | Meunier et al. ............. 704/222 |
| 6,611,800 | B1 * | 8/2003 | Nishiguchi et al. .......... 704/221 |

FOREIGN PATENT DOCUMENTS

| | | |
|---|---|---|
| EP | 788091 | 8/1997 |
| EP | 831457 | 3/1998 |
| EP | 1103953 | 5/2001 |
| JP | 61-252600 | 11/1986 |
| JP | 01319799 | 12/1989 |
| JP | 4-328800 | 11/1992 |
| JP | 07191700 | 7/1995 |
| JP | 07271397 | 10/1995 |
| JP | 08044400 | 2/1996 |
| JP | 8-185200 | 7/1996 |
| JP | 08185200 | 7/1996 |
| JP | 9-234797 | 9/1996 |
| JP | 09214349 | 8/1997 |
| JP | 1097298 | 4/1998 |
| JP | 11052994 | 2/1999 |
| JP | 01154699 | 6/2001 |

OTHER PUBLICATIONS

English Language Abstract of JP 4-328800.
English Language Abstract of JP 8-185200.
English Language Abstract of JP 8-234797.
Mano et al., "Discussion about High Efficient MA Predicting LSP Parameter Quantization," IEICE, General Convention Lecture Notes, Information System 1, D-14-23, p. 193 (Mar. 7, 2001).
Merazka et al., "Very Low Bit-Rate Vector Quantization of LSP Parameters," Computational Intelligence for Modeling, Control & Automation, pp. 374-379 (1999).
Erdmann et al., "An Adaptive Multi Rate Wideband Speech Codec with Adaptive Gain Re-Quantization," Speech Coding 2000, Proceedings 2000 IEEE Workshop on Sep. 17-20, 2000, pp. 145-147 (Sep. 17, 2000).
Pan et al., "Vector Quantization—Lattice Vector Quantization of Speech LPC Coefficients," Acoustics, Speech, and Signal Processing, 1994; 1994 IEEE International Conference on Adelaida, SA, Australia, vol. i, pp. I-513 to I-516 (Apr. 19, 1994).
English Language Abstract of JP Appln. No. 10-97298.
English Language Abstract of JP Appln. No. 01-319799.
English Language Abstract of JP Appln. No. 07-191700.
English Language Abstract of JP Appln. No. 2001-154699.
English Language Abstract of JP Appln. No. 07-271397.
English Language Abstract of JP Appln. No. 08-044400.
English Language Abstract of JP Appln. No. 11-052994.
English Language Abstract of JP Appln. No. 09-214349.
Schroeder et al., IEEE proc., "Code-Excited Linear Prediction (CELP): High-Quality Speech at Very Low Bit Rates", ICASSP'85, pp. 937-940.
Linde et al., "An Algorithm for Vector Quantizer Design", IEEE Transactions on Communications, vol. COM-28, No. 1, pp. 84-95, Jan. 1980.
Itakura, J. "Line Spectrum Representation of Linear Predictor Coefficients of Speech Signals", Acoust. Soc. Am., vol. 57, supplemental No. 1, pp. S35, Apr. 1975.
Paliwal et al., "Efficient Vector Quantization of LPC Parameters at 24 Bits/Frame", IEEE Transactions of Speech and Audio Processing, vol. 1, pp. 3-14, Jan. 1993.
Kataoka et al., "An 8-kb/s Conjugate Structure CELP (CS-CLEP) Speech Coder", IEEE Transaction on Speech and Audio Processing, vol. 4, No. 6, pp. 401-411, Nov. 1996.
Hagen et al., "Voicing-Specific LPC Quantization for Variable-Rate Speech Coding", IEEE Transaction on Speech and Audio Processing, vol. 7, No. 5, pp. 485-494, Sep. 1999.
Schroeder, "Direct (Nonrecursive) Relations Between Cepstrum and Predictor Coefficients", IEEE Transactions on Acoustics, Speech, and Signal Processing, vol. ASSP-29, No. 2, pp. 297-301, Apr. 1981.
Lloyd, "Least Squares Quantization in PCM", IEEE Transactions Inform. Theory, IT-28, pp. 1229-137, 1982.
Deller et al., "Discrete-Time Processing of Speech Signals", Macmillan Publishing Co., 1993. p. 480-483.

* cited by examiner

LPC VECTOR QUANTIZATION APPARATUS

TECHNICAL FIELD

The present invention relates to an LPC vector quantization apparatus applicable to a speech coder/decoder used to enhance transmission efficiency of a speech signal in the fields of a packet communication system represented by Internet communication and mobile communication system, etc.

BACKGROUND ART

When a speech signal is transmitted in a packet communication system represented by Internet communication or mobile communication system, a compression/coding technology is often used to enhance transmission efficiency of the speech signal. Many speech coding systems have been developed so far, and many lowbit rate speech coding systems developed in recent years separate a speech signal into a spectral envelope information and a sound source information and compress/code the separated information pieces. For example, a CELP system described in Document 1 (M. R. Schroeder, B. S. Atal, "Code Excited Linear Prediction: High Quality Speech at Low Bit Rate", IEEE proc., ICASSP'85 pp.937-940) is one of its examples.

Here, an overview of a CELP-based speech coder will be explained using FIG. 1. Suppose an input speech signal is input to a speech coder successively every processing frame delimited by a time interval of approximately 20 ms.

The input speech signal input to the speech coder for every processing frame is supplied to an LPC analysis section 11 first. The LPC analysis section 11 carries out an LPC (Linear Predictive Coding) analysis on the input speech signal, obtains an LPC vector having LPC coefficients as vector components, vector-quantizes the LPC vector obtained to obtain an LPC code, and decodes this LPC code to obtain a decoded LPC vector having decoded LPC coefficients as vector components.

An excitation vector generation section 14 reads an adaptive codevector and fixed codevector from an adaptive codebook 12 and a fixed codebook 13 respectively and sends those codevectors to an LPC synthesis filter 15. The LPC synthesis filter 15 performs synthesis filtering on the adaptive codevector and the fixed codevector supplied from the excitation vector generation section 14 using an all-pole model synthesis filter having the decoded LPC coefficients given from the LPC analysis section 11 as filter coefficients and obtains a synthesized adaptive codevector and a synthesized fixed codevector, respectively.

A comparison section 16 analyzes a relationship between the synthesized adaptive codevector, the synthesized fixed codevector output from the LPC synthesis filter 15 and the input speech signal, and calculates an adaptive codebook optimum gain to be multiplied on the synthesized adaptive codevector and a fixed codebook optimum gain to be multiplied on the synthesized fixed codevector, respectively. Furthermore, the comparison section 16 adds up the vector obtained by multiplying the synthesized adaptive codevector by the adaptive codebook optimum gain and the vector obtained by multiplying the synthesized fixed codevector by the fixed codebook optimum gain to obtain a synthesized speech vector and calculates a distortion between the synthesized speech vector obtained and input speech signal.

The comparison section 16 further calculates distortions between many synthesized speech vectors obtained by operating the excitation vector generation section 14 and LPC synthesis filter 15 on all possible combinations of adaptive codevectors stored in the adaptive codebook 12 and fixed codevectors stored in the fixed codebook 13, and the input speech signal, determines an index of an adaptive codevector and an index of a fixed codevector that minimize the distortions from among those codevectors and sends the indices of the codevectors output from the respective codebooks, codevectors corresponding to the indices and an adaptive codebook optimum gain and fixed codebook optimum gain corresponding to the indices to a parameter coding section 17.

The parameter coding section 17 codes the adaptive codebook optimum gain and fixed codebook optimum gain to obtain gain codes, and outputs the gain codes obtained, the LPC code given from the LPC analysis section 11 and the indices of the respective codebooks together for each processing frame.

The parameter coding section 17 further adds up two vectors; a vector obtained by multiplying the adaptive codevector corresponding to the index of the adaptive codebook by an adaptive codebook gain corresponding to the gain code and a vector obtained by multiplying the fixed codevector corresponding to the index of the fixed codebook by a fixed codebook gain corresponding to the gain code, thereby obtains an excitation vector and updates the old adaptive codevector in the adaptive codebook 12 with the excitation vector obtained.

For synthesis filtering by the LPC synthesis filter 15, it is a general practice that linear predictive coefficients, high-pass filter and perceptual weighting filter using a long-term predictive coefficient obtained by carrying out a long-term predictive analysis on the input speech are used together. It is also a general practice that a search for optimum indices of the adaptive codebook and fixed codebook, calculation of optimum gains and coding processing of optimum gains are carried out in units of a subframe obtained by subdividing a frame.

Next, an overview of processing of "vector quantization of LPC vector" carried out by the LPC analysis section 11 will be explained in more detail using FIG. 2. Suppose that an LPC codebook 22 stores a plural entries of typical LPC vectors acquired beforehand by applying the LBG algorithm to many LPC vectors obtained by actually carrying out an LPC analysis on input speech signals of many processing frames. With regard to the LBG algorithm, the details of its technology are disclosed in Document 2 (Y. Linde, A. Buzo, R. M. Gray, "An Algorithm for Vector Quantizer Design," IEEE trans. Comm., Vol. COM-28, No. 1, pp84-95, January, 1980).

A quantization target vector input to the vector quantizer in FIG. 2 (an LPC vector obtained by carrying out an LPC analysis on a speech signal in a processing frame section corresponds to the quantization target) is supplied to a distortion calculation section 21. Next, the distortion calculation section 21 calculates a Euclidean distortion between an LPC codevector stored in the LPC codebook 22 and the quantization target vector according to the following Expression (1):

$$d_m = \sum_{i=1}^{N} (X_T(i) - C_m(i))^2 \qquad \text{Expression (1)}$$

where in Expression (1), $X_T$ is a quantization target vector, $C_m$ is an mth ($1 \leq m \leq M$) LPC codevector in the LPC codebook, i is a component number of a vector, N is the order of a vector (corresponds to an LPC analysis order) and $d_m$ is a Euclidean distortion between $X_T$ and $C_m$.

The distortion calculation section 21 successively calculates Euclidean distortions between all LPC codevectors stored in the LPC codebook 22 and the quantization target vector, then successively outputs the calculation results(respective Euclidean distortions) to an LPC codebook search section 23. The LPC codebook search section 23 compares the respective Euclidean distortions supplied from the distortion calculation section 21 and outputs an index of an LPC codevector that minimizes the Euclidean distortion as an LPC code (coded expressing spectral envelope information on the processing frame).

On the other hand, it is possible to obtain decoded LPC coefficients (decode LPC coefficients) by reading out the LPC codevector corresponding to the index indicated by the LPC code from the LPC codebook. By the way, since the processing of generating decoded LPC coefficients, which are used for constituting an all-pole model LPC synthesis filter, from the LPC code is generally carried out by both the speech coder and speech decoder.

In many speech coders/decoders developed in recent years, LPC vector is not quantized as it is, and it is a general practice that an LPC vector is converted to an LSF (Line Spectral Frequency) vector having LSF parameters as vector components or an LSP (Line Spectral Pairs) vector having LSP parameters as vector components, which are one-to-one mutually convertible frequency domain vectors, and then vector-quantized. This is because vector-quantizing the LPC vector after converting it to a vector in the frequency domain rather than directly vector-quantizing the LPC vector in time domain has higher quantization efficiency and higher interpolation characteristic. By the way, features of the LSF (or LSP) vector and a method for mutual conversion with the LPC vector are disclosed in Document 3 (F. Itakura, "Line Spectrum Representation of Linear Predictive Coefficients of Speech Signals," J. Acoust. Soc. Amer., vol 57, p.S35, April 1975) or Document 4 (L. K. Paliwal and B. S. Atal, "Efficient Vector Quantization of LPC Parameter at 24 Bits/Frame," IEEE trans. on Speech and Audio Processing, vol. 1, pp. 3-14, January 1993).

For example, when the LSF vector is quantized, an LSF vector $LSF_T[i]$ (i=1, ..., N) in the frequency domain obtained by converting the LPC vector, is input to the vector quantizer as the quantization target vector. In this case LPC codebook stores candidate LSF codevectors $LSF_m[i]$ (i=1, ..., N) each vector having LSF parameters as vector components, it is possible to vector-quantize the target LSF vector using the same procedure as that when the target LPC vector is vector-quantized. However, when LSF (or LSP) vector is quantized, the weighted Euclidean distortion $d_m$ in Expression (2) below instead of Expression (1) above is often used as a measure for an LPC codebook search.

$$d_m = \sum_{i=1}^{N} [w(i) * (LSF_T(i) - LSF_m(i))]^2$$

The weighted Euclidean distortion is disclosed in detail, for example, in Document 4 or Document 5 (A. Kataoka, T. Moriya and S. Hayashi, "An 8-kb/s Conjugate Structure CELP (CS-CELP) Speech Coder," IEEE trans. Speech and Audio Processing, vol. 4, No. 6, pp.401-411, November 1996) or Document 6 (R. Hagen, E. Paksoy, and A. Gersho, "Voicing-Specific LPC Quantization for Variable-Rate Speech Coding," IEEE trans. Speech and Audio Processing, vol. 7, no. 5, pp.485-494, September, 1999).

By the way, it is possible to obtain decoded LSF parameters (decode LSF parameters) by reading out the LSF codevector corresponding to the index indicated by the LPC code from the LPC codebook by using the same manner as that for obtaining decoded LPC coefficients from LPC codes, that is, reading out a decoded LPC codevector corresponding to an LPC code from a codebook. In this case, however, the decoded LSF parameters read based on the LPC code are parameters in the frequency domain. Thus, additional processing for converting the decoded LSF parameters in the frequency domain to decoded LPC coefficients in the time domain for constructing an all-pole model LPC synthesis filter is required.

With regard to a speech coder/decoder according to a CELP system, etc., LPC parameters representing short-time spectral envelope information of a speech signal (hereinafter LPC coefficients and parameters such as LSF which are mutually convertible with LPC coefficients will be generically referred to as "LPC parameters") are generally compressed/coded by a vector quantizer. However, when a vector quantizer in a simple configuration as shown in FIG. 2 is applied as is, quantization distortion generated by each processing frame will increase, failing to obtain preferable synthesized speech. For this reason, a lot of researches such as "predictive vector quantization technology", "multistage vector quantization technology" and "split vector quantization technology" have been made so far for improving the vector quantizer performance. In order to design a high performance vector quantizer, it is indispensable to use many of these technologies in combination.

By the way, when a vector quantizer of LPC vector is newly designed (or improved), an evaluation measure to compare/evaluate the performance of the quantizer is required. When evaluating the performance, it is preferable to use an evaluation measure considering that the LPC parameters are originally the parameters to express short-time spectral envelope information of a speech signal. Thus, CD (Cepstral Distortion) measure in Expression (3) below which evaluates distortion in the LPC cepstrum domain corresponding to an LPC spectrum model or SD (Spectral Distortion) measure in Expression (4) below which evaluates distortion in an FFT (Fast Fourier Transformation) spectral domain is often used as a performance evaluation measure:

$$CD = \frac{1}{L}\left\{\sum_{i=1}^{L} CD^{(l)}\right\} = \qquad \text{Expression (3)}$$

$$\frac{1}{L}\left\{\sum_{i=1}^{L} \frac{10}{\log_{10}} \sqrt{2\sum_{i=1}^{N_c} \left(CEP_t^{(l)}[i] - CEP_q^{(l)}[i]\right)^2}\right\}$$

where in Expression (3), L is the number of data frames used for evaluation, l is a frame number, Nc is the order of an LPC cepstrum (when the LPC analysis order N is the $10^{th}$ order, Nc is often on the order of the 16th order), $CEP_t^{(l)}[i]$ is a target LPC cepstrum obtained by converting a quantization target of the first processing frame and $CEP_q^{(l)}[i]$ is LPC cepstrum obtained by converting decoded LPC vector of the first processing frame. The technological details of the features of the LPC cepstrum and method of mutual conversion between LPC vector and LPC cepstrum are disclosed, for example, in Document 7 (M R. Shroeder, "Direct (Nonrecursive) Relations Between Cepstrum and Predictor Coefficients, "IEEE trans. on vol. ASSP-29, No.2, pp.297-301, April, 1981.).

$$SD = \frac{1}{L}\left\{\sum_{l=1}^{L} SD^{(l)}\right\} = \frac{1}{L}\left\{\sum_{l=1}^{L} \frac{10}{\log_{10}}\right.$$
$$\left.\sqrt{\frac{4}{K}\sum_{j=1}^{K/2}\left(\log_{10}[SP_t^{(l)}(\omega_j)] - \log_{10}[SP_t^{(l)}(\omega_j)]\right)^2}\right\}$$

Expression (4)

where in Expression (4), L is the number data frames used for evaluation, l is a frame number, K is the number of FFT points, $SP_t^{(l)}(\omega j)$ is an FFT power spectrum of a quantization target of the lth processing frame, $SP_q^{(l)}(\omega j)$ is an FFT power spectrum of a decoded LPC vector of the l-th processing frame and $\omega j = 2\pi j/K$. The technological details of the features of SD are disclosed, for example, in Document 4 above.

Both CD in Expression (3) and SD in Expression (4) are obtained by adding up quantization distortion generated in each processing frame throughout the evaluation data and then averaging the addition result by the number of data frames in the evaluation data, which means that the smaller the CD or SD, the higher the performance of the vector quantizer.

When an LPC vector is vector-quantized, a Euclidean distortion Expression (1) or weighted Euclidean distortion Expression (2) is used as a reference measure for a LPC codebook search. On the other hand, the performance of the LPC vector quantizer is generally evaluated using CD described in Expression (3) or SD described in Expression (4) as a performance evaluation measure. That is, in LPC vector quantizers developed so far, a reference measure used for LPC codebook search is different from a reference measure used for evaluating the vector quantizer performance. For this reason, the LPC code selected by LPC codebook search is not always an index for minimizing CD or SD measure. This causes a problem in designing a high performance vector quantizer.

As the simplest method for solving the problem above, it may be reasonable to convert candidate LPC vectors to mutually convertible LPC cepstrums (or FFT power spectrums) and store them in a codebook beforehand, then converting an target LPC vector input in every frame to a target LPC cepstrum (or a target FFT power spectrum) and selecting an LPC cepstrum codevector (or FFT power spectrum codevector) using CD (or SD) as a distortion measure. However, the above solution method causes a drastic increase of the memory capacity for storing candidate codevectors. Moreover, when a vector quantizer is conceived which uses "predictive vector quantization technology" or "multistage vector quantization technology" frequently used in a low bit rate speech coding system, it is necessary to store vectors with no mutual convertibility with an LPC cepstrum (for example, predictive residual vector or quantization error vector) in a codebook beforehand, and therefore the above solution method cannot be employed.

DISCLOSURE OF INVENTION

It is an object of the present invention to provide an LPC vector quantization apparatus capable of enhancing the quantization performance of an LPC vector quantizer and improving the quality of synthesized speech in a speech coder/decoder.

This object is attained when a target LSF vector is vector-quantized by a pre-selection for selecting a preset small number of codevectors from many candidate LSF codevector entries stored in an LSF codebook according to a weighted Euclidean distortion measure, further final search for selecting a final code from the small number of pre-selected LSF codevectors according to the CD or SD measure.

BEST MODE FOR CARRYING OUT THE INVENTION

With reference now to the attached drawings, embodiments of the present invention will be explained below.

Embodiment 1

Figure 1:
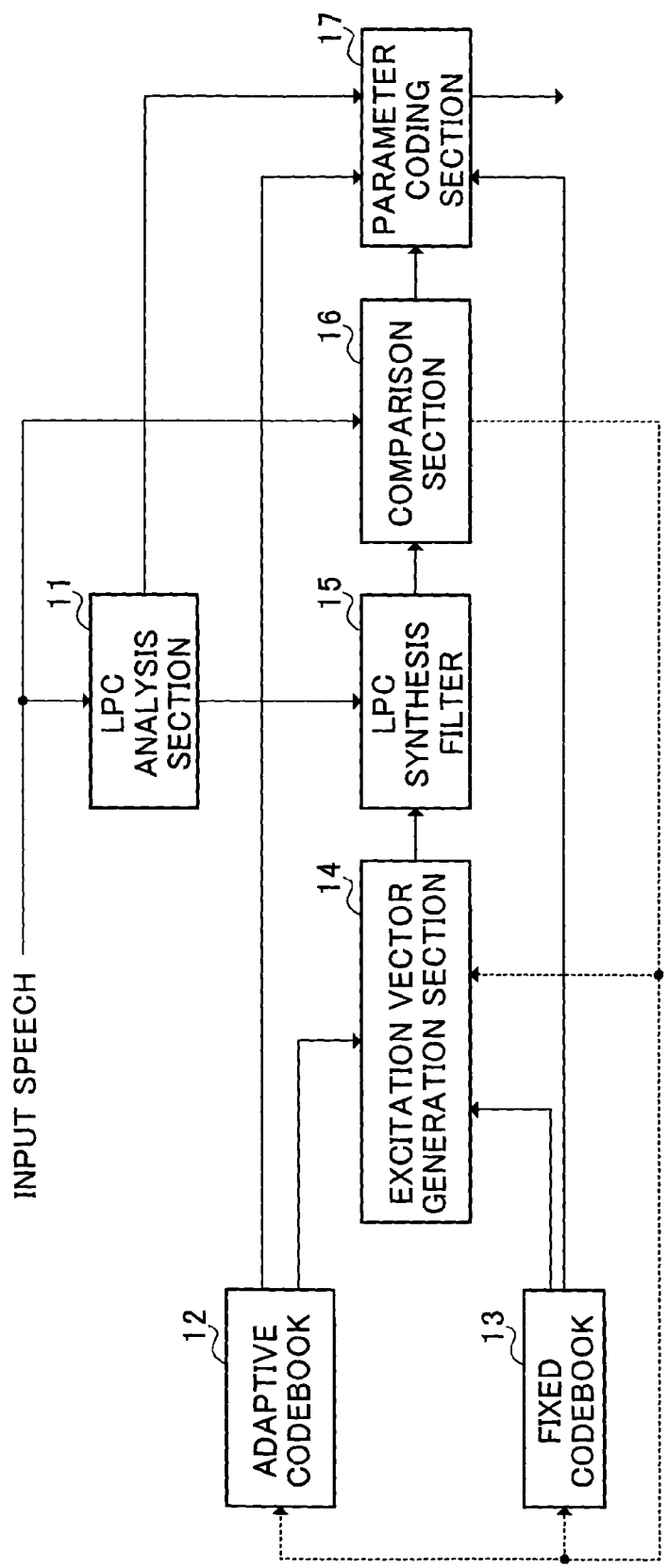
FIG. 1 is a block diagram showing a configuration of a CELP-based speech coder.
Figure 2:
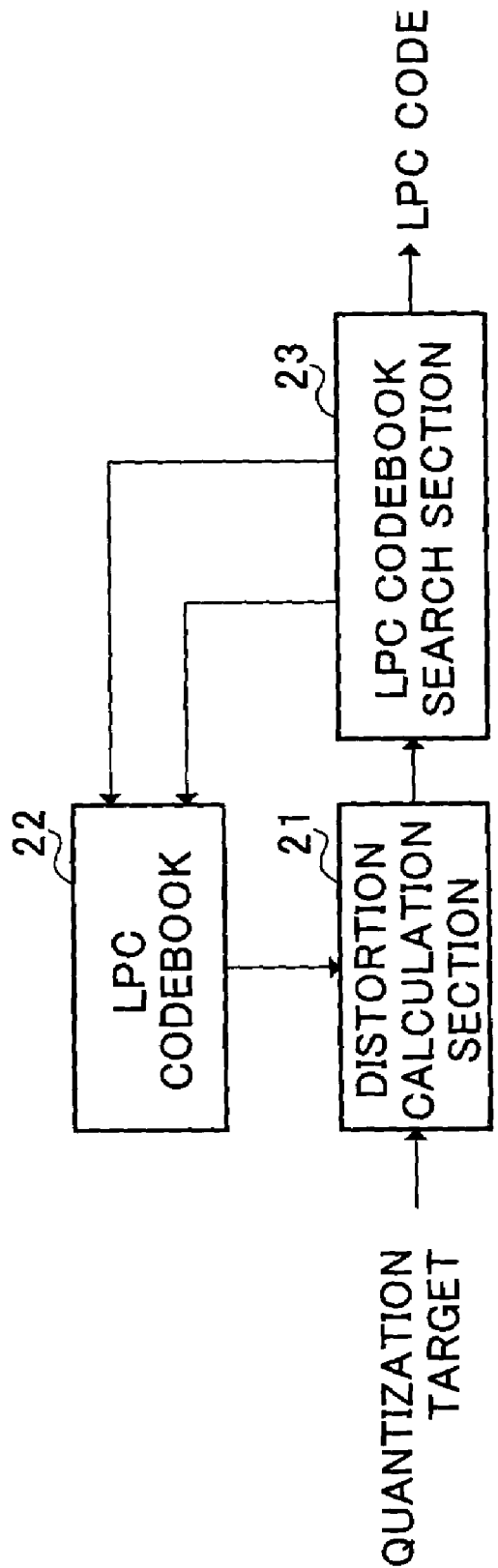
FIG. 2 is a block diagram showing a basic configuration of a conventional LPC vector quantization apparatus.
Figure 3:
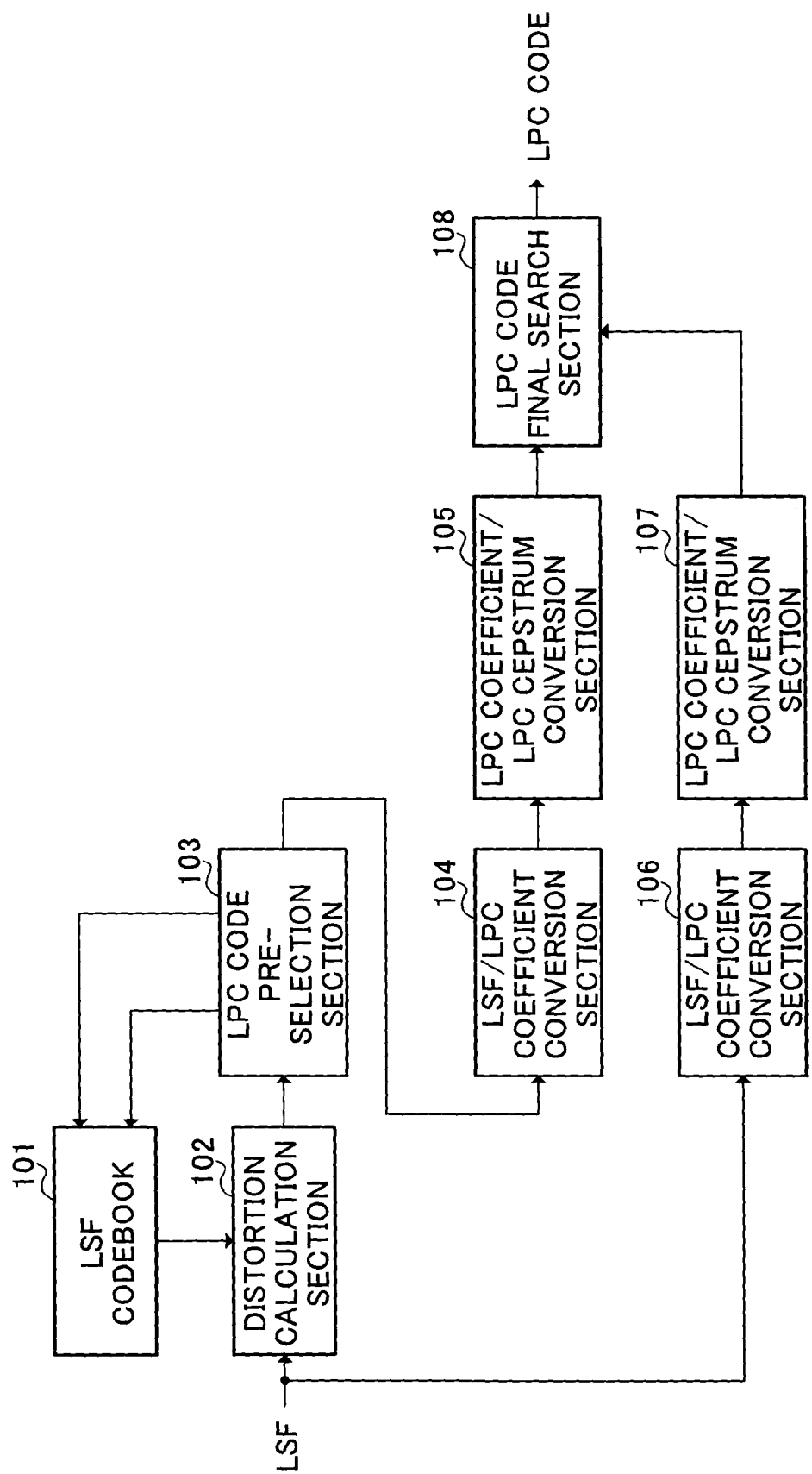
FIG. 3 is a block diagram showing a configuration of an LPC vector quantization apparatus according to Embodiment 1 of the present invention.

An LPC vector quantization apparatus according to the present invention will be explained using FIG. 3. FIG. 3 is a block diagram showing a configuration of the LPC vector quantization apparatus according to Embodiment 1 of the present invention.

This vector quantization apparatus is provided with an LSF codebook 101 that stores LSF codevector entries, a distortion calculation section 102 that calculates distortions between LSF codevector entries in the LSF codebook 101 and a target LSF vector, an LPC code pre-selection section 103 that preliminarily selects a preset small number of LPC codes based on the distortions calculated by the distortion calculation section 102, LSF/LPC conversion sections 104 and 106 that convert LSF vector to LPC coefficients, LPC coefficient/LPC cepstrum conversion sections 105 and 107 that convert LPC coefficients to LPC cepstrum and an LPC code final search section 108 that finally selects an LPC code based on the results of distortion evaluation in the LPC cepstrum domain.

Suppose the LSF codebook 101 of the vector quantization apparatus in the above-described configuration stores M candidate LSF codevector entries acquired beforehand by the LBG algorithm. Furthermore, suppose the LPC vector quantization apparatus according to this embodiment carries out an LPC analysis on a speech signal in a processing frame section to obtain LPC coefficients, further converts the LPC coefficients obtained to an LSF vector and inputs the LSF vector obtained as a quantization target vector. Hereafter, a quantization target vector may be expressed with symbol $LSF_T[i]$ (i=, ..., N), where N is an LPC analysis order.

The quantization target LSF vector, $LSF_T[i]$ (i=1, ..., N), input to the vector quantization apparatus is supplied to the distortion calculation section 102 and LSF/LPC conversion section 106 first. On the other hand, the LSF codebook 101 supplies an LSF codevector $LSF_m[i]$ (i=1, ..., N) corresponding to the instruction information (index m is supplied as information) supplied from the LPC code pre-search section 103 to the distortion calculation section 102.

The distortion calculation section 102 calculates a weighted Euclidean distortion between the quantization target vector, $LSF_T[i]$ (i=1, ..., N), and an LSF codevector, $LSF_m[i]$ (i=1, ..., N), according to the above-described Expression (2) and outputs the calculation result $d_m$ to the LPC code pre-selection section 103. After receiving the distortion $d_m$ corresponding to index m, the LPC code pre-selection section 103 instructs the LSF codebook 101 to output another LSF codevector corresponding to the next index (m+1).

In the case LSF codebook 101 stores M candidate LSF codevectors, the processing at the LPC code pre-selection section 103 is repeated M times until M distortions between LSF quantization target vector and M candidate LSF vector are obtained, and the M distortions are output to the LPC code pre-selection section 103. In this way, M distortions $d_m$ (m=1, ..., M) are input to the LPC code pre-selection section 103 at the time of completion of the processing by the LPC code pre-selection section 103.

The LPC code pre-selection section 103 compares the values of the M weighted Euclidean distortions input, and selects S candidate indices with smallest weighted Euclidean distortion value (in this embodiment, suppose the number S is preset) and records the selected S candidate indices in Ncand [j] (j=1, ..., S) (any one of indices 1 to M is recorded in Ncand[j]). Then, it instructs the LSF codebook 101 of the indices recorded in Ncand[j] (j=1, ..., S) and receives the corresponding LSF codevectors $LSF_{Ncand[j]}[i]$ (i=1, ..., N, j=1, ..., S) from the LSF codebook 101. Then, the S LSF codevectors received are output to the LSF/LPC conversion section 104.

The LSF/LPC conversion section 104 converts the preliminarily selected S LSF codevectors $LSF_{Ncand[j]}[i]$ (i=1, ..., N, j=1, ..., S) supplied from the LPC code pre-selection section 103 to their respective LPC coefficients to obtain $LPC_{Ncand[j]}[i]$ (i=1, ..., N, j=1, ..., S) and outputs the S sets of LPC coefficients obtained to the LPC coefficient/LPC cepstrum conversion section 105.

The LPC coefficient/LPC cepstrum conversion section 105 converts the S sets of LPC coefficients $LPC_{Ncand[j]}[i]$ (i=1, ..., N, j=1, ..., S) supplied from the LSF/LPC conversion section 104 to their respective LPC cepstra, $CEP_{Ncand[j]}[i]$ (i=1, ..., Nc, j=1, ..., S: Nc is the order of an LPC cepstrum, and outputs the S LPC cepstra obtained to the LPC code final search section 108.

On the other hand, the LSF/LPC conversion section 106 converts a quantization target $LSF_T[i]$ (i=1, ..., N) to an LPC coefficients to obtain $LPC_T[i]$ (i=1, ..., N) and outputs the LPC coefficients obtained to the LPC coefficient/LPC cepstrum conversion section 107. The LPC coefficient/LPC cepstrum conversion section 107 converts the LPC coefficients $LPC_T[i]$ (i=1, ..., N) supplied from the LSF/LPC coefficients conversion section 106 to an LPC cepstrum to obtain $CEP_T[i]$ (i=1, ..., Nc) and outputs the LPC cepstrum obtained to the LPC code final search section 108.

Then, the LPC code final search section 108 calculates distortions between S candidates LPC cepstra, $CEP_{Ncand[j]}[i]$ (i=1, ..., Nc, j=1, ..., S), supplied from the LPC coefficient/LPC cepstrum conversion section 105 and the target LPC cepstrum, $CEP_T[i]$ (i=1, ..., N, j=1, ..., S), supplied from the LPC coefficient/LPC cepstrum conversion section 107 according to Expression (5) below and retains the respective calculation results in Dj (j=1, ..., S).

$$D_j = \sum_{i=1}^{N_c} (CEP_T[i] - CEP_{Ncand[j]}[i])^2, \quad \text{Expression (5)}$$

$$j = 1, \ldots, S$$

Then, the LPC code final search section 108 compares the values of Dj (j=1, ..., S), specifies one index j that minimizes Dj (the specified j is expressed as J here) and outputs Ncand [J] corresponding to the specified J as the LPC code of the relevant processing frame (code to express spectral envelope information of a speech signal of the relevant processing frame). By the way, it is obvious from the relationship between Expression (5) and Expression (3) that "J" selected using the minimization of Expression (5) above as a reference is identical to the LPC code (assumed to be "J'") selected using the minimization of Expression (3) as a reference.

By the way, to give generality to explanations, this embodiment assumes that the number of LSF codevectors stored in the LSF codebook 101 is M and the number of codevectors preliminarily selected by the LPC code pre-selection section 103 is S. The above-described value M is determined by the number of bits allocated to the LPC parameter vector quantization apparatus. For example, when 21 bits per frame are allocated to the vector quantization apparatus shown in FIG. 3, the value m becomes an extremely large number of $2^{21}$. Furthermore, the above-described value S can be freely set, but it is often set to 8, 16 or about 32 empirically or through an advance performance evaluation test.

Then, the processing of generating decoded LPC coefficients (also referred to as "decoding processing of LPC parameter") from the LPC code (Ncand[J]) output from the vector quantization apparatus shown in FIG. 3 will be explained using the LPC vector decoder shown in FIG. 4. However, the decoder shown in FIG. 4 is provided with the same LSF codebook 201 as that in the vector quantization apparatus and a codevector reading section 202 that reads an LSF codevector from the LSF codebook 201.

Figure 4:
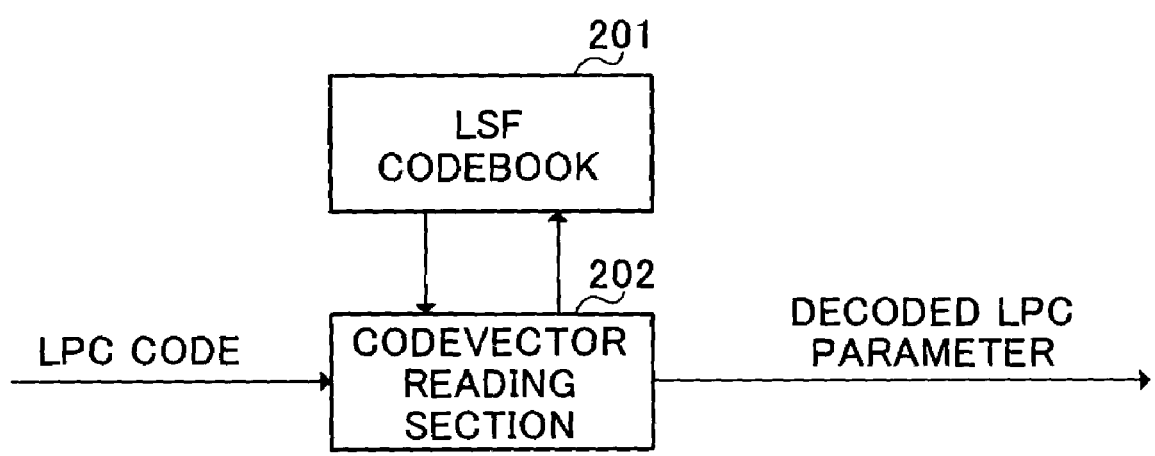
FIG. 4 is a block diagram illustrating a method for creating a decoded LPC vector according to Embodiment 1 of the present invention.

LPC code, Ncand[J], input to the LPC vector decoder shown in FIG. 4 is supplied to the codevector reading section 202 first. Then, the codevector reading section 202 instructs the LSF codebook 201 to output an LSF codevector corresponding to the LPC code, Ncand[J]. Then, the LSF codebook 201 outputs $LSF_{Ncand[J]}[i]$ (i=1, ..., N) to the codevector reading section 202. The codevector reading section 202 outputs the vector supplied from the LSF codebook 201 as decoded LSF vector.

Since the decoded LSF vector output from the LPC vector decoder above is parameters in the LSF-domain, an additional processing for converting the decoded LSF vector in the LSF-domain to decoded LPC coefficients in the LPC-domain for constructing an all-pole model LPC synthesis filter is required.

According to the above-described LPC vector quantization apparatus, when the target LSF vector which is a quantization target is vector-quantized, it is possible to preliminarily select the preset small number of LSF codevectors from all candidate LSF codevectors stored in the LSF codebook using a weighted Euclidean distortion as a measure and it is possible to fully select a final code from the small number of preselected candidate LSF codevectors based on the pre-selection result using the CD minimization as a measure.

Therefore, using the vector quantization apparatus according to the above-described embodiment makes it possible to reduce the problem of the conventional technology (problem that a selected LPC code by the vector quantization apparatus often mismatches an index of the codevector that minimizes the CD) without drastically increasing the amount of calculation required for an LPC codebook search and improve the performance of the LPC vector quantization apparatus.

By the way, according to this embodiment, when the vector quantization apparatus of the present invention is compared with the vector quantization apparatus explained in the section of the prior art, the vector quantization apparatus of the present invention slightly increases the amount of calculation required for the search of LPC codebook. The portion corresponding to the increase in the amount of calculation can be summarized as the following six points:

(1) Amount of calculation to convert quantization target to target LPC coefficients (2) Amount of calculation to convert the target LPC vector in (1) to a target LPC cepstrum (3) Amount of calculation to convert preliminarily selected small number of LPC codevectors to the small number of LPC coefficients (4) Amount of calculation to convert the small number of LPC vectors in (3) to the small number of LPC cepstra (5) Amount of calculation to calculate distortions between the target LPC cepstrum in (2) and the small number of LPC cepstra in (4)

(6) Amount of calculation to compare distortions in (5) and specify an index of a codevector that minimizes distortion In this case, it is generally possible to control the increase of the above-described amount of calculation by the number of candidates of the codevectors preliminarily selected and left (this is because it is (3), (4), (5) and (6) that substantially dominate the amount of calculation in (1) to (6) and these are directly dependent on the number of candidates in the pre-selection). That is, according to the vector quantization apparatus of the present invention, it is possible to freely adjust a tradeoff relationship between the increase in the amount of calculation required for an LPC codebook search and the improvement of performance by increasing/decreasing the number of preliminarily selected candidates set in the LPC code pre-selection section 103. Thus, this embodiment makes it possible to improve the performance of the vector quantization apparatus considering the increase in the amount of calculation required for an LPC codebook search.

Furthermore, this embodiment has described the case where the number of candidate LSF codevectors left by the LPC code pre-selection section is predetermined, but it is also possible to use other pre-selection methods such as setting a threshold for a weighted Euclidean distortion and leaving a candidate whose weighted Euclidean distortion is smaller than the set threshold as a candidate after the pre-selection, and the same effect/operation can also be obtained in this case, too.

Furthermore, this embodiment has described the case where the LPC code pre-selection section carries out pre-selection of an LSF codevector using the weighted Euclidean distortion of Expression (2) above as a measure, but the present invention can also be implemented when a weighted Euclidean distortion which is different from above-described Expression (2) such as Expression (8) and Expression (10) in the aforementioned Document 4 is used, and the same effect/operation can also be obtained in this case, too.

By the way, with respect to the "weight" in a weighted Euclidean distortion, various calculation methods have been proposed so far (e.g., a method described in Document 5 where weighting is calculated according to the distances between adjacent elements of an LSF parameters, a method described in Document 6 where weighting is calculated according to a power spectrum of a quantization target), but the present invention is applicable irrespective of the method of calculating "weight" and the same effect/operation can also be obtained in this case, too.

Furthermore, this embodiment has described the case where the LPC vector input to the vector quantization apparatus is LSF, but the present invention is also applicable when other vector expressing short-time spectral envelope information of a speech signal such as LSP vector, PARCOR vector having a PARCOR parameters as vector components, LPC vector is input to the vector quantization apparatus as a target vector and the same effect/operation can also be obtained in this case, too.

However, in the case where LSP is input as a quantization target, for example, it is necessary to change the LSF/LPC conversion sections 104 and 106 to the LSP/LPC conversion sections and change the LSF codebook 101 to the LSP codebook.

Furthermore, this embodiment has described the case where the LPC code final search section specifies a final LPC code using the CD measure, but if the LPC coefficient/LPC cepstrum conversion sections (105, 107) is replaced by an LPC coefficient/FFT power spectrum calculation section that has the function of calculating an FFT power spectrum from LPC coefficients and Expression (5) above as the calculation expression executed by the LPC code final search section 108 is replaced by the calculation expression inside the square root portion of Expression (4), SD (Spectral Distortion) can also be used as a measure to specify the final LPC code and the same effect/operation can also be obtained in this case, too.

As explained above, it is understandable that the vector quantization apparatus according to this embodiment is preferably applicable to cases where short-time spectral envelope information of a speech signal is coded/decoded by a speech coder/decoder based on a CELP system or Vocoder system.

Embodiment 2

This embodiment will explain the configuration of a vector quantization apparatus, processing procedure and effect/operation thereof when the technology according to the present invention is applied to the LPC vector quantization apparatus using a predictive vector quantization technology, multistage vector quantization technology and split vector quantization technology together.

The configuration of the vector quantization apparatus strongly depends on the bit rate of the entire speech coder/decoder and the number of bits allocated to the LPC vector quantization apparatus. Here, for simplicity of explanation, a vector quantization apparatus with 21-bit bit information per processing frame of a time interval of 20 ms allocated will be explained as a specific example below.

Furthermore, more specifically, suppose the vector quantization apparatus used in this explanation uses a third-order MA (Moving Average) prediction technology and uses 4 sets of MA predictive coefficients per processing frame (2-bit information is required for MA predictive coefficients switching). Moreover, suppose the vector quantization apparatus used in the explanation uses a 2-stage vector quantization technology. Furthermore, suppose the vector quantization apparatus used in the explanation uses a split vector quantization technology at the second stage of the 2-stage vector quantization apparatus. By the way, the first stage vector quantizer, the vector quantizer of the second stage lower frequency components and the vector quantizer of the second stage higher frequency components are assigned 7 bits, 6 bits and 6 bits, respectively.

Figure 5:
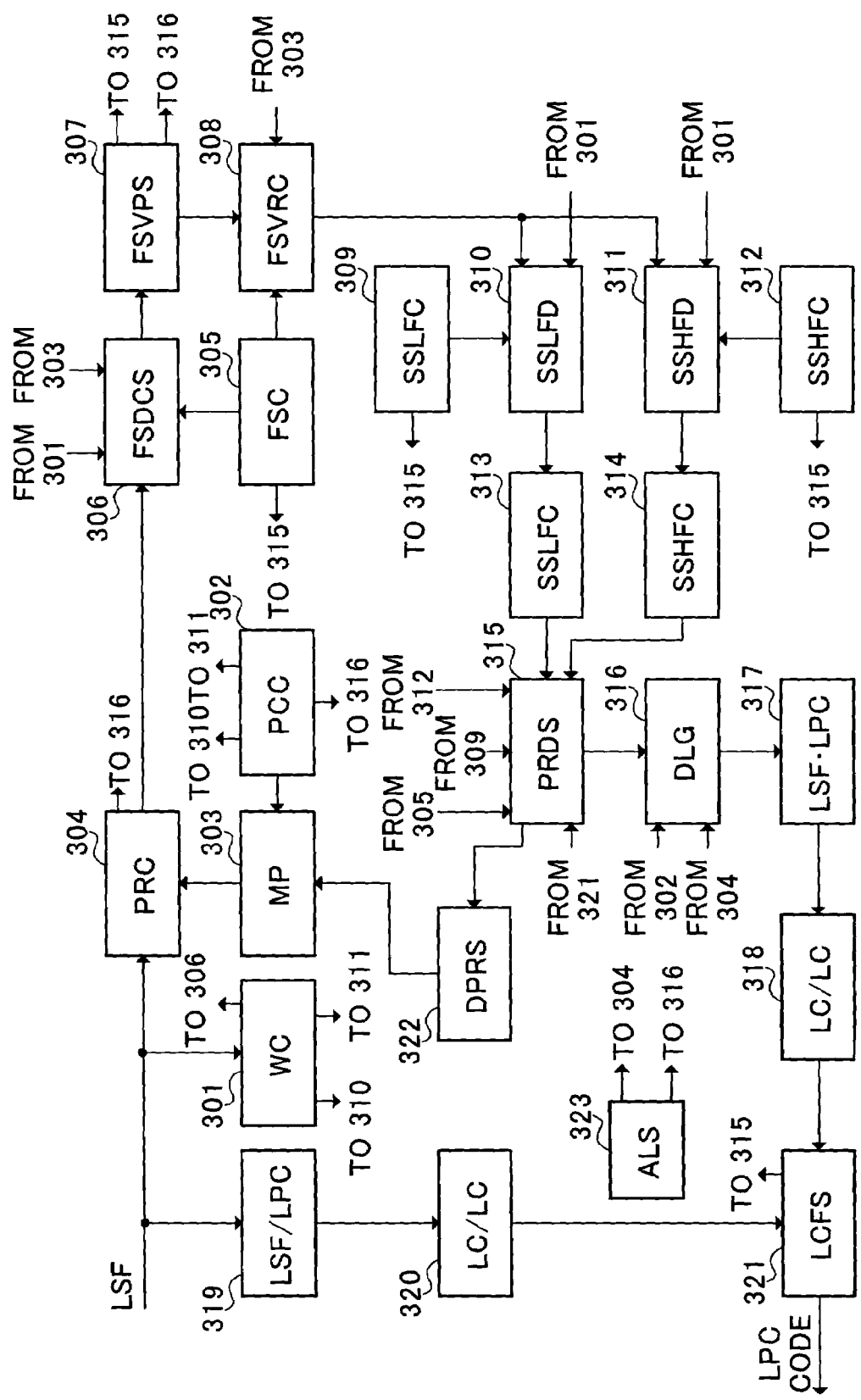
FIG. 5 is a block diagram showing a configuration of an LSF vector quantization apparatus according to Embodiment 2 of the present invention.

FIG. 5 is a block diagram showing a configuration of a vector quantization apparatus according to Embodiment 2 the present invention. As shown in FIG. 5, the vector quantization apparatus in a 2-stage split configuration using third-order MA prediction to which the technology according to the present invention is applied is provided with a weight calculation section (WC) 301, a predictive coefficient codebook (PCC) 302, an MA predictor (MP) 303, a predictive residual calculation section (PRC) 304, a first stage codebook (FSC) 305, a first stage distortion calculation section (FSDCS) 306, a first stage VQ pre-selection section (FSVPS) 307, a first stage VQ residual calculation section (FSVRC) 308, a second stage lower frequency codebook (SSLFC) 309, a second stage lower frequency distortion calculation section (SSLFD) 310, a second stage higher frequency distortion calculation section (SSHFD) 311, a second stage higher frequency codebook (SSHFC) 312, a second stage lower frequency codebook search section (SSLFC) 313, a second stage higher frequency codebook search section (SSHFC) 314, a predictive residual decoding section (PRD) 315, a decoded LSF generation section (DLG) 316, LSF/LPC coefficient conversion sections (LSF/LPC) 317 and 319, LPC coefficient/LPC cepstrum conversion sections (LC/LC) 318 and 320 and an LPC code final search section (LCFS) 321.

In the explanation of FIG. 5, the processing after an LSF vector is input until a target vector of the first stage vector quantizer is obtained (processing corresponding to the weight calculation section 301, predictive coefficient codebook 302, MA predictor 303 and predictive residual calculation section 304) will be explained in detail.

LSF vector input to the vector quantization apparatus in FIG. 5 are supplied to the weight calculation section 301, predictive residual calculation section 304 and LSF/LPC conversion section 319. The weight calculation section 301 calculates a "weight" used to calculate a weighted Euclidean distortion based on the LSF vector and outputs this weight(s) to the first stage distortion calculation section 306, second stage lower frequency distortion calculation section 310 and second stage higher frequency distortion calculation section 311.

By the way, as the method for calculating "weight" by the weight calculation section 301, the method described in Document 5 for calculating "weight" according to a distance between adjacent elements of LSF parameters or the method described in Document 6 for calculating "weight" according to a power spectrum of LSF vector, etc., can be used. This embodiment assumes that no special limit is set for calculation of "weight."

The MA predictor 303 calculates predictive vectors using decoded predictive residual vectors corresponding to the past 3 frames stored in the decoding predictive residual storage section (DPRS) 322 and third-order MA predictive coefficients stored in the predictive coefficient codebook 302 and outputs the calculated predictive vector to the predictive residual calculation section 304.

By the way, suppose that the above-described processing of calculating/outputting a predictive vector is carried out for each of the 4 sets of third-order MA predictive coefficients stored in the predictive coefficient codebook 302. Therefore, a total of four sets of predictive vectors are output from the MA predictor 303. Furthermore, the four sets of predictive coefficients stored in the MA predictor 303 are acquired beforehand by applying the generalized Lloyd algorithm disclosed in Document 8 (S. P. Lloyd, "Least Square Quantization in PCM," IEEE trans. Inform. Theory IT-28, pp. 129-137, 1982), etc., to four sets of arbitrarily initialized MA predictive coefficients. Hereafter, for simplicity of explanation, suppose the four sets of third-order MA predictive coefficients will be represented with symbols $MA_k[j][i]$.

In the above-described symbol notation, $k(=1, \ldots, 4)$ corresponds to a set number of the third-order MA predictive coefficients, $j$ ($=0, \ldots, 3$) corresponds to a frame number ($j=0$ corresponds to the current processing frame, $j=1$ corresponds to the processing frame one frame ahead of the current processing frame, $j=2$ corresponds to the processing frame 2 frames ahead of the current processing frame, $j=3$ corresponds to the processing frame 3 frames ahead of the current processing frame), $i$ ($=1, \ldots, N$: N is an LPC analysis order) corresponds to a number of vector component of the predictive coefficients.

The predictive residual calculation section 304 differentiates average LSF parameters ($AV[i]$, $i=1, \ldots, N$) stored in the average LSF storage section (ALS) 323 from the LSF parameters. By the way, the aforementioned average LSF parameters ($AV[i]$, $i=1, \ldots, N$) are parameters obtained beforehand in the stage prior to actual coding/decoding processing by averaging the entire sets of LSF parameters of a training speech signal, and stored in the average LSF storage section 323. Then, the predictive residual calculation section 304 differentiates the predictive vectors supplied from the MA predictor 303 from the vector obtained by the aforementioned difference, calculates a predictive residual vector and outputs the calculated predictive residual vector as a target vector of the first stage vector quantizer to the first stage distortion calculation section 306, first stage VQ residual calculation section 308 and decoded LSF generation section 316.

By the way, the above-described processing of calculating/outputting the predictive residual vector is carried out for each of 4 sets of MA predictive coefficients. Therefore, a total of four entries of target vectors of the first stage vector quantizer are output from the predictive residual calculation section 304.

The processing after the LSF parameter is input until the target vector of the first stage vector quantizer is obtained has been explained in detail so far. Next, the processing of the first stage vector quantizer of the 2-stage vector quantizer (processing corresponding to the first stage codebook 305, first stage distortion calculation section 306, first stage VQ pre-selection section 307 and first stage VQ residual calculation section 308) will be explained in detail.

The first stage codebook 305 stores 128 entries of predictive residual codevectors. By the way, 128 entries of predictive residual codevectors are acquired before hand by carrying out a series of the above-described processes until a quantization target is calculated on speech signals in many processing frames, obtaining many predictive residual vectors, applying an LBG algorithm to the many predictive residual vectors obtained, extracting 128 entries of typical samples of predictive residual vectors and further applying the generalized Lloyd algorithm disclosed in the aforementioned Document 8, etc.

The first stage distortion calculation section 306 calculates a weighted Euclidean distortion between the target vector ($X_k[i]$, i=1, ..., N) of the first stage vector quantizer supplied from the predictive residual calculation section 304 and the vector ($MA_k[0][i]*C_m[i]$, i=1, ..., N) obtained by multiplying the predictive residual codevector ($C_m[i]$, i=1, ..., N) with index m read from the first stage codebook 305 by the current processing frame component of the MA predictive coefficient ($MA_k[0][i]$, i=1, ..., N) according to Expression (6) below and outputs the calculated distortion value to the first stage VQ pre-selection section 307.

$$d_{k,m} = \sum_{i=1}^{N} \{w[i]*(X_k[i] - MA_k[0][i]*C_m[i])\}^2 \quad \text{Expression (6)}$$

where, in Expression (6), w[i] is "weight" calculated by the weight calculation section 301, k is a set number (k=1, ..., 4) of the MA predictive coefficients, m is an index (m=1, ..., 128) of the predictive residual codevector in the first stage codebook.

The above-described weighted Euclidean distortion is calculated by the first stage distortion calculation section 306 on 512(=128×4) combinations of 128 entries (m=1, ..., 128) of predictive residual codevectors ($C_m[i]$, i=1, ..., N) stored in the first stage codebook 305 and 4 sets (k=1, ..., 4) of MA predictive coefficients used to generate target vectors ($X_k[i]$, i=1, ..., N) supplied from the predictive residual calculation section 304. Therefore, a total of 512 distortions $d_{k,m}$(k=1, ..., 4, m=1, ..., 128) are output from the first stage distortion calculation section 306 to the first stage VQ pre-selection section 307.

The first stage VQ pre-selection section 307 compares above-described 512 distortions $d_{k,m}$ (k=1, ..., 4, m=1, ..., 128) supplied from the first stage distortion calculation section 306, selects N1 types of combination information of k (to which third-order predictive coefficient set of the 4 sets of third-order MA predictive coefficients corresponds) and m (to which codevector of the 128 entries of codevectors in the first stage codebook 305 corresponds), and records the selected k and m into N1cand_k[j] and N1cand_m[j] respectively, and outputs the recorded N1cand_k[j] and N1cand_m[j] (j=1, ..., N1) to the first stage VQ residual calculation section 308, predictive residual decoding section 315 and decoded LSF generation section 316.

Using third-order predictive coefficient set (read from the predictive coefficient codebook 302) corresponding to the information on N1 combinations of N1cand_k[j] and N1cand_m[j] (j=1, ..., N1) supplied from the first stage VQ pre-selection section 307 and the codevector (read from the first stage codebook 305) in the first stage codebook, the first stage VQ residual calculation section 308 calculates N1 first stage VQ residual vectors $X_j^{(2)}[i]$ (i=1, ..., N, j=1, ..., N1) which remain after the pre-selection processing according to Expression (7) below and outputs the calculated N1 vectors to the second stage lower frequency distortion calculation section 310 and second stage higher frequency distortion calculation section 311.

$$X_j^{(2)}[i] = X_{N1cand\_k[j]}[i] - MA_{N1cand\_k[j]}[0][i] \\ *C_{N1cand\_m[j]}[i], \, i=1,\ldots,N, j=1,\ldots,N1 \quad \text{Expression (7)}$$

By the way, the second stage vector quantizer of this embodiment adopts a split configuration, decomposing (split-ting) the first stage VQ residual vector into lower frequency components (i=1, ..., NL) and higher frequency components (i=NL+1, ..., N) and vector-quantizing the respective vectors obtained by splitting separately.

Therefore, $X_j^{(2)}[i]$ (i=1, ..., N, j=1, ..., N1) calculated by the first stage VQ residual vector calculation section 308 is output to the second stage lower frequency distortion calculation section 310 and second stage higher frequency distortion calculation section 311 in accordance with the configuration of the second stage vector quantizer. More specifically, $X_j^{(2)}[i]$ (i=1, ..., NL, j=1, ..., N1) is output to the second stage lower frequency distortion calculation section 310 and $X_j^{(2)}[i]$ (i=NL+1, ..., N, j=1, ..., N1) is output to the second stage higher frequency distortion calculation section 311.

The processing of the first stage vector quantizer of the 2-stage vector quantizer has been explained in detail so far. Next, the processing of the second stage vector quantizer of the second stage vector quantizer (processing corresponding to the second stage lower frequency codebook 309, second stage lower frequency distortion calculation section 310, second stage higher frequency distortion calculation section 311, second stage higher frequency codebook 312, second stage lower frequency codebook search section 313 and second stage higher frequency codebook search section 314) will be explained in detail.

The second stage lower frequency codebook 309 stores 64 entries of second stage lower frequency codevectors ($C2L_{m2L}[i]$, i=1, ..., NL, m2L=1, ..., 64). By the way, the aforementioned 64 entries of codevectors are acquired beforehand by carrying out processing until the last processing of the first stage vector quantizer which calculates the first stage VQ residual vectors on speech signals in many processing frames, obtaining many lower frequency components of many first stage VQ residual vectors, applying the LBG algorithm to the many lower frequency components of many first stage VQ residual vectors obtained, extracting 64 entries of typical lower frequency components of the first stage VQ residual vector and further applying the generalization Lloyd algorithm disclosed in the aforementioned Document 8, etc., to the extracted 64 entries of typical lower frequency components of the first stage VQ residual vectors.

On the other hand, the second stage higher frequency codebook 312 stores the 64 entries of second stage higher frequency codevectors ($C2H_{m2H}[i]$, i=NL+1, ..., N, m2H=1, ..., 64) acquired by applying the same method used by the second stage lower frequency codebook 309 to acquire lower frequency components of the first stage VQ residual codevectors.

The second stage lower frequency distortion calculation section 310 calculates a weighted Euclidean distortion between the lower frequency components $X_j^{(2)}[i]$ (i=1, ..., NL, j=1, ..., N1) of the first stage VQ residual vector supplied from the first stage VQ residual calculation section 308 and a vector ($MA_{N1cand\_k[j]}[0][i]*C2L_{m2L}[i]$, i=1, ..., NL) obtained by multiplying the second stage lower frequency codevector ($C2L_{m2L}[i]$, i=1, ..., NL) of the index m2L read from the second stage lower frequency codebook 309 by the current processing frame component ($MA_{N1cand\_k[j]}[0][i]$, i=1, ..., NL) of the MA predictive coefficients according to Expression (8) below and outputs the calculated distortion value $d2L_{j,m2L}$ to the second stage lower frequency codebook search section 313.

$$d2L_{j,m2L} = \quad \text{Expression (8)}$$

-continued $$\sum_{i=1}^{NL} \{w[i]*(X_j^{(2)}[i] - MA_{N1cand\_k[j]}[0][i]*C2L_{m2L}[i])\}^2,$$

$$j = 1, \ldots, N1, m2L = 1, \ldots, 64$$

where, w[i] in Expression (8) is the same "weight" in Expression (6).

By the way, suppose that the second stage lower frequency distortion calculation section 310 carries out the distortion calculation in Expression (8) above on the 64 entries of codevectors stored in the second stage lower frequency codebook 309 for each j and outputs all the weighted Euclidean distortions $d2L_{j,m2L}$ (j=1, ..., N1, m2L=1, ..., 64) obtained to the second stage lower frequency codebook search section 313 (a total of N1*64 $d2L_{j,m2L}$ are output).

The second stage higher frequency distortion calculation section 311 carries out the same processing as that of the second stage lower frequency distortion calculation section 310 on the vector higher frequency component and outputs a weighted Euclidean distortion $d2H_{j,m2H}$ (j=1, ..., N1, m2H=1, ..., 64) to the second stage higher frequency codebook search section 314 (a total of N1*64 $d2H_{j,m2H}$ are output).

The second stage lower frequency codebook search section 313 specifies one index m2L that minimizes the distortion for each j for the weighted Euclidean distortion $d2L_{j,m2L}$ (j=1, ..., N1, m2L=1, ..., 64) supplied from the second stage lower frequency distortion calculation section 310 and records the specified N1 (j=1, ..., N1) indices in N2Lcand[j] (j=1, ..., N1), respectively and outputs the recorded N1 N2Lcand[j] (j=1, ..., N1) to the predictive residual decoding section 315.

The second stage higher frequency codebook search section 314 specifies one index m2H that minimizes the distortion for each j for the weighted Euclidean distortion $d2H_{j,m2H}$ (j=1, ..., N1, m2H=1, ..., 64) supplied from the second stage higher frequency distortion calculation section 311, records the specified N1 (j=1, ..., N1) indices in N2Hcand[j] (j=1, ..., N1) and outputs the recorded N1 N2Hcand[j] (j=1, ..., N1) to the predictive residual decoding section 315.

So far, the processing of the second stage vector quantizer of the second stage vector quantizer has been explained in detail. By the way, by the time the processing of the above-described second stage vector quantizer is completed, N1 (j=1, ..., N1) combinations of the following four information pieces have been supplied to the predictive residual decoding section 315:

(1) N1cand_k[j]: Which of 4 sets of MA predictive coefficients is preliminarily selected (2) N1cand_m[j]: Which of 128 entries of first stage codevectors is preliminarily selected (3) N2Lcand[j]: Which of 64 entries of second stage lower frequency codevectors is preliminarily selected (4) N2Hcand[j]: Which of 64 entries of second stage higher frequency codevectors is preliminarily selected The following explanations of this embodiment will give details of the processing of specifying the combination number of the combination information that minimizes CD from among N1 combination information pieces supplied to the predictive residual decoding section 315 by the processing so far (the processing corresponding to the predictive residual decoding section 315, decoded LSF generation section 316, LSF/LPC coefficient conversion sections 317 and 319, LPC coefficient/LPC cepstrum conversion sections 318 and 320, LPC code final search section 321).

The predictive residual decoding section 315 reads codevectors ($C_{N1cand\_m[j]}$, $C_2L_{N2Lcand[j]}$ and $C2H_{N2Hcand[j]}$) corresponding to 3 entries of index information (N1cand_m[j], N2Lcand[j] and N2Hcand[j]) from the first stage codebook 305, second stage lower frequency codebook 309 and second stage higher frequency codebook 312, respectively, calculates N1 (J=1, ..., N1) decoded predictive residual vectors $Cq_j[i]$ (i=1, ..., N) according to Expression (9) below using those codevectors, records/retains the calculated decoded predictive residual vectors and outputs the decoded predictive residual vectors to the decoded LSF generation section 316.

$$Cq_j[i]=C_{N1cand\_m[j]}[i]+C2L_{N2Lcand[j]}[i]+C2H_{N2Hcand[j]}[i], j=1,\ldots,N1, i=1,\ldots,N \quad \text{Expression (9)}$$

where in Expression (9), $C2L_{N2Lcand[j]}[i]=0.0$ (i=NL+1, ..., N), $C2H_{N2Hcand[j]}[i]=0.0$ (i=1, ..., NL).

The predictive residual decoding section 315 also outputs N1cand_k[j] (j=1, ..., N1) to the decoded LSF generation section 316.

The decoded LSF generation section 316 reads $MA_{N1cand\_k[j]}[0][i]$ corresponding to N1cand_k[j] (j=1, ..., N1) supplied from the predictive residual decoding section 315 from the predictive coefficient codebook 302, calculates N1 (j=1, ..., N1) decoded LSF parameters (hereinafter referred to as "LSFq_j[i], j=1, ..., N1, i=1, ..., N") according to Expression (10) below using the $MA_{N1cand\_k[j]}[0][i]$ read above, average LSF parameter AV[i] (i=1, ..., N) read from the average LSF storage section 323, $X_{N1cand\_k[j]}[j]$ corresponding to N1cand_k[j] of the quantization target vector supplied from the predictive residual calculation section 304 and Cqj[i] (i=1, ..., N) supplied from the predictive residual decoding section 315 and outputs the calculated decoded LSF parameters to the LSF/LPC coefficient conversion section 317.

$$LSFq_j[i]=AV[i]+X_{N1cand\_k[j]}[i]+MA_{N1cand\_k[j]}[0][i]*Cq_j[i], j=1,\ldots,N1, i=1,\ldots,N \quad \text{Expression (10)}$$

The LSF/LPC coefficient conversion section 317 converts N1 (j=1, ..., N1) decoded LSF parameters (LSFq_j[i], j=1, ..., N1, i=1, ..., N) supplied from the decoded LSF generation section 316 to decoded LPC coefficients (hereinafter referred to as "LPCqj[i], j=1, ..., N1, i=1, ..., N") respectively, and outputs the decoded LPC coefficients to the LPC coefficient/LPC cepstrum conversion section 318.

The LPC coefficient/LPC cepstrum conversion section 318 converts N1 (j=1, ..., N1) decoded LPC coefficients (LPCq_j[i], i=1, ..., N) supplied from the LSF/LPC coefficient conversion section 317 to decoded LPC cepstra (hereinafter referred to as "QCEP_j[i], i=1, ..., Nc, j=1, ..., N1") and outputs the decoded LPC cepstra to the LPC code final search section 321.

The LSF/LPC coefficient conversion section 319 converts the LSF parameters to LPC coefficients and outputs the LPC coefficients to the LPC coefficient/LPC cepstrum conversion section 320. The LPC coefficient/LPC cepstrum conversion section 320 converts the LPC coefficients supplied from the LSF/LPC coefficient conversion section 319 to LPC cepstrum (hereinafter referred to as "CEP_r[i], i=1, ..., Nc") and outputs the LPC cepstrum to the LPC code final search section 321.

The LPC code final search section 321 calculates a distortions DIS_j (j=1, ..., N1) between the LPC cepstrum (CEP_r[i], i=1, ..., Nc) supplied from the LPC coefficient/LPC cepstrum conversion section 320 and N1 (j=1, ..., N1) decoded LPC cepstra (QCEP$_j$[i], i=1, ..., Nc, j=1, ..., N1) supplied from the LPC coefficient/LPC cepstrum conversion section 318 according to Expression (11) below and then compares the sizes of DIS$_j$ (j=1, ..., N1) and specifies one index "J" that minimizes the distortion.

$$DIS_j = \sum_{i=1}^{N_C} (CEP_t(i) - QCEP_j(i))^2,$$

$$j = 1, \ldots, N1$$

Expression (11)

By the way, it is obvious from the relationship between Expression (11) and Expression (3) that the same index is selected when the minimization of Expression (11) above is used as a reference measure to specify the index and when the minimization of CD in Expression (3) is used as a reference measure to specify the index.

Then, 21-bit information combining the following four information items corresponding to the specified index "J", that is:

(1) N1cand_k[j]: Which of 4 sets of MA predictive coefficients is optimal (using 2 bits)

(2) N1cand_m[j]: Which of 128 entries of first stage codevectors is optimal (using 7 bits)

(3) N2Lcand[j]: Which of 64 entries of second stage lower frequency codevectors is optimal (using 6 bits)

(4) N2Hcand [j]: Which of 64 entries of second stage higher frequency codevectors is optimal (using 6 bits) is output as an LPC code of the relevant processing frame (code to express spectral envelope information on the processing frame section).

The LPC codebook search supplies the index J that minimizes DIS$_j$ to the predictive residual decoding section 315. Then, the predictive residual decoding section 315 selects vector Cq$_j$[i] (i=1, ..., N) corresponding to the index J from among N1 (j=1, ..., N1) retained/stored decoded predictive residual vectors Cq$_j$[i] (i=1, ..., N) and outputs them to the decoding predictive residual storage section 322.

The decoding predictive residual storage section 322 discards the oldest decoded predictive residual vector of the decoded predictive residual vectors corresponding to a plurality of past frames stored (since this embodiment carries out third-order MA prediction, the decoded predictive residual vectors corresponding to the past 3 frames are stored) and newly retains Cq$_j$[i] (i=1, ..., N) newly supplied from the predictive residual decoding section 315 for MA prediction of the next processing frame.

The explanation so far describes the content of a series of processes after the LSF parameter is input to the vector quantization apparatus until the LPC code is output. On the other hand, the decoder of the LSF parameters output from the vector quantization apparatus (also the decoder of the LPC coefficients obtained by converting the LSF parameters) can comprise a step of decomposing an LPC code into four index information pieces (N1cand_k[J], N1cand_m[J], N2Lcand [J] and N2Hcand[J]), a step of calculating a decoded predictive residual vector based on each piece of index information obtained in the step of decomposing an LPC code and a step of generating a decoded LSF vector based on the decoded predictive residual vector obtained in the step of calculating a decoded predictive residual vector. More specifically, in the step of decomposing an LPC code, an LPC code is decomposed into four index information pieces (N1cand_k[J], N1cand_m[J], N2Lcand[J] and N2Hcand[J]) first. Then, in the step of calculating a decoded predictive residual vector, by reading the first stage codevector $C_{N1cand\_m[J]}$ from the first stage codebook 305 based on index information N1cand_m [J], then reading the second stage lower frequency codevector $C2L_{N2Lcand[J]}$ from the second stage lower frequency codebook 309 based on the index information N2Lcand[J], reading second stage higher frequency codevector $C2H_{N2Hcand[J]}$ from the second stage higher frequency codebook 312 based on index information N2Hcand[J] and carrying out the addition processing described in Expression (9) on the three read vectors, it is possible to obtain a decoded predictive residual vector Cq$_j$[i] (i=1, ..., N) corresponding to the LPC code. Then, in the step of creating a decoded LSF vector, by reading $MA_{N1cand\_k[J]}[0][i]$ corresponding to index information N1cand_k[J] from the predictive coefficient codebook 302 and according to Expression (10) using the read $MA_{N1cand\_k[J]}[0][i]$, the average LSF parameter AV[i] (i= 1, ..., N) read from the average LSF storage section 323, $X_{N1cand\_k[J]}$ corresponding to N1cand_k[J] of the quantization target vector supplied from the predictive residual calculation section 304 and Cq$_j$[i] (i=1, ..., N) supplied from the predictive residual decoding section 315, it is possible to obtain a final decoded LSF parameter (herein after referred to as "LSFq$_j$[i], i=1, ..., N"). By the way, when the decoded LSF parameter is further converted to a decoded LPC coefficient, it is possible to provide a step having the same function as that of the LSF/LPC coefficient conversion section 317 after the above-described step of generating a decoded LSF vector.

When LSF parameters are vector-quantized, the vector quantization apparatus having a 2-stage split structure using third-order MA prediction explained in detail so far preliminarily selects codes using a weighted Euclidean distortion as a measure, and can thereby select optimum codes for the remaining candidates after the pre-selection using CD (Cepstram Distortion) as a reference measure.

Therefore, using the vector quantization apparatus according to the embodiment above can solve the problem of the conventional technology (problem that an LPC code selected by the vector quantization apparatus does not match the index of the codevector that minimizes CD) without drastically increasing the amount of calculation required for an LPC codebook search and improve the performance of the LPC parameter vector quantization apparatus.

By the way, according to the vector quantization apparatus of the present invention, the first stage VQ pre-selection section 307 controls the number of codevectors to be selected preliminarily and can thereby freely control the increment in the amount of calculation required for an LPC codebook search as in the case of Embodiment 1. That is, the present invention can improve the performance of the vector quantizer taking account of the increment in the amount of calculation required for an LPC codebook search.

Furthermore, this embodiment has described the case where the number of codevector candidates N1 left by the first stage VQ pre-selection section 307 is predetermined (N1 is often determined through experiments or empirically to values such as 8, 16, 32 and 64), but it is also possible to use other pre-selection methods, for example, setting a threshold as a weighted Euclidean distortion and leaving candidates whose weighted Euclidean distortion is smaller than the set threshold as candidates after the pre-selection and similar effect/ operation can be obtained in this case, too.

Furthermore, this embodiment has described the case where the first stage VQ pre-selection section 307 preliminarily selects codevectors using the weighted Euclidean distortion in Expression (2) above as a measure, but the present invention can also be implemented when a weighted Euclidean distortion whose mathematical expression is different from Expression (2) above such as Expression (8) or Expression (10) in the aforementioned Document 4 is used, and similar effect/operation to those of this embodiment can be obtained in this case, too.

By the way, with respect to "weight" of a weighted Euclidean distortion, various calculation methods have been proposed (e.g., the method of carrying out weighting according to a distortion between neighboring elements of LSF parameters described in Document 5 or the method of carrying out weighting according to a power spectrum of a quantization target described in Document 6), but the present invention is applicable irrespective of the method of calculating "weight" and similar effect/operation can be obtained in this case, too.

Furthermore, this embodiment has described the case where input vector is an LSF vector, but this embodiment is also applicable to cases where other parameters expressing short-time spectral envelope information of a speech signal such as LSP vector, PARCOR coefficients or an LPC vector is vector-quantized and similar effect/operation can be obtained in this case, too.

Furthermore, this embodiment has described the case where the LPC code final search section 321 specifies a final LPC code using CD (Cepstral Distortion) as a measure, but it is also possible to replace the LPC coefficient/LPC cepstrum conversion sections 318 and 320 with the LPC coefficient/FFT power spectrum calculation section having the function of calculating an FFT power spectrum from the LPC coefficient and further changing the calculation expression carried out by the LPC code final search section 32 from Expression (11) above to the calculation expression in the square root portion in Expression (4) above to use the SD (Spectral Distortion) as the final measure of the LPC code search section, and similar effect/operation can be obtained in this case, too.

Furthermore, this embodiment has described an example of a vector quantizer having a specific structure called "2-stage split structure using third-order MA prediction" for simplicity of explanation, but this embodiment is also applicable to an LPC parameter vector quantization apparatus having a structure other than this example and similar effect/operation can be obtained in this case, too.

This embodiment explained above is preferably applicable to coding/decoding of short-time spectral envelope information of a speech signal in a speech coder/decoder based on a CELP system or Vocoder system.

Embodiment 3

Figure 6:
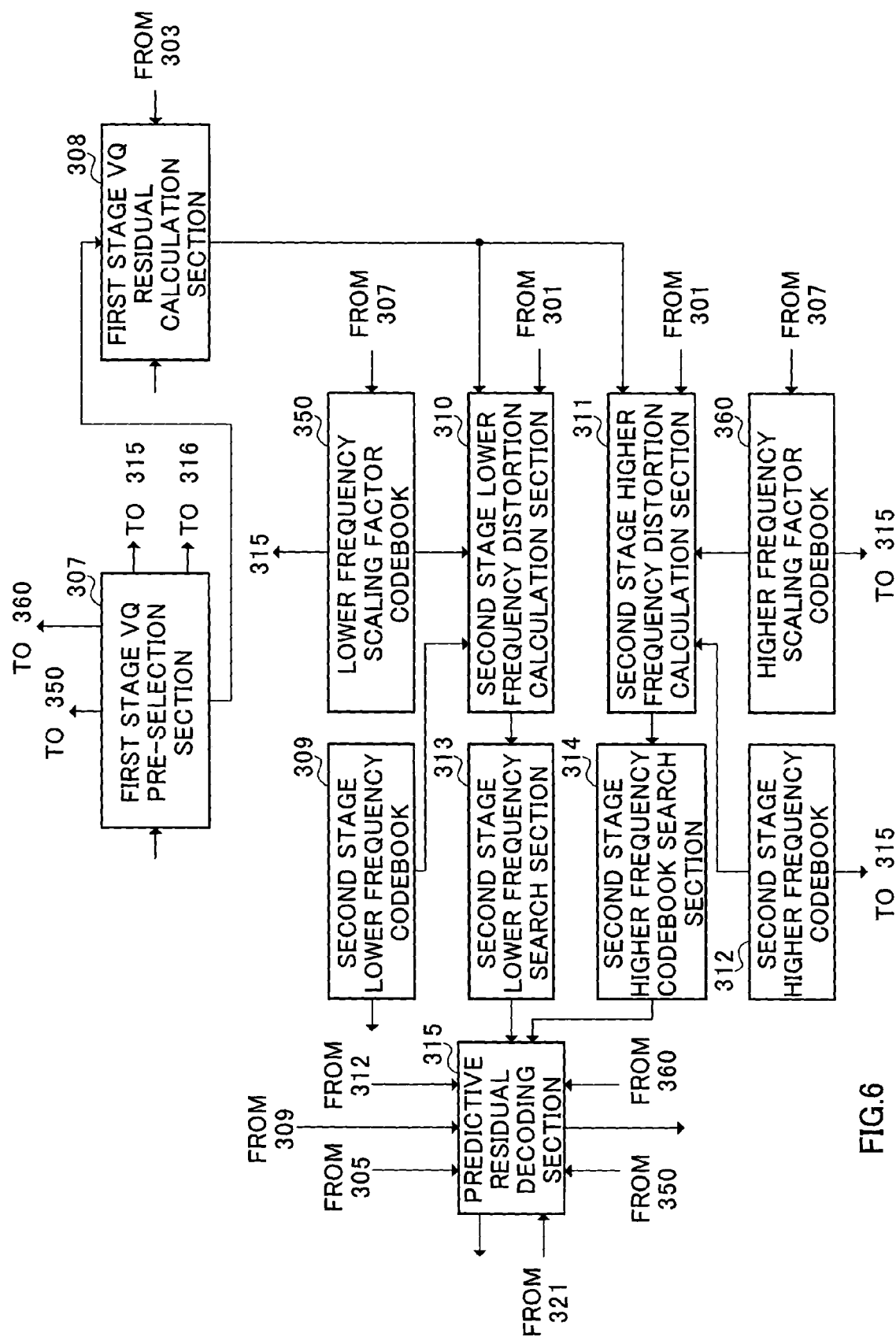
FIG. 6 is a block diagram showing a configuration of an LSF vector quantization apparatus according to Embodiment 3 of the present invention.

FIG. 6 is a block diagram showing a configuration of a vector quantization apparatus according to Embodiment 3. By the way, components of the vector quantization apparatus shown in FIG. 6 common to those in FIG. 5 explained in Embodiment 2 are assigned the same reference numerals as those in FIG. 5 and detailed explanations thereof will be omitted.

The vector quantization apparatus shown in FIG. 6 adopts a configuration with a lower frequency scaling factor codebook 350 and a higher frequency scaling factor codebook 360 added to the vector quantization apparatus in FIG. 5. By the way, in FIG. 6, components 301 to 306 and 316 to 323 are omitted to make drawings easier to see.

By the way, as in the case of Embodiment 2, the configuration of the vector quantization apparatus strongly depends on the bit rate of the entire speech coder/decoder and the number of bits allocated to the LPC parameter vector quantization apparatus. Here, for simplicity of explanation, suppose bit information with 21 bits per processing frame of a time interval of 20 ms is assigned.

Furthermore, suppose the vector quantization apparatus which will be explained in this embodiment also uses third-order MA (Moving Average) prediction technology and uses 4 sets of (2 bits required as switching information) MA predictive coefficients per processing frame. Furthermore, suppose the vector quantization apparatus which will be explained in this embodiment uses a 2-stage vector quantization technology. Furthermore, suppose the vector quantization apparatus which will be explained in this embodiment uses a split vector quantization technology for the second stage of the 2-stage vector quantization apparatus. By the way, suppose that the first stage vector quantizer, the vector quantizer of the second stage lower frequency component and the vector quantizer of the second stage higher frequency component are assigned 7 bits, 6 bits and 6 bits, respectively.

The vector quantization apparatus in FIG. 6 carries out processing after an LSF parameter is input until a target vector of the first stage vector quantizer is obtained (processing corresponding to the weight calculation section 301, predictive coefficient codebook 302, MA predictor 303 and predictive residual calculation section 304). By the way, the details of the processing are the same as those of the processing of the corresponding sections in Embodiment 2, and therefore explanations thereof will be omitted in this embodiment.

Then, the vector quantization apparatus in FIG. 6 carries out the processing by the first stage vector quantizer of the 2-stage vector quantizer (processing corresponding to the first stage codebook 305, first stage distortion calculation section 306, first stage VQ pre-search section 307 and first stage VQ residual calculation section 308).

The processing of the first stage vector quantizer by the 2-stage vector quantizer of the vector quantization apparatus according to this embodiment will be explained in detail below.

The first stage codebook 305 stores 128 entries of predictive residual codevectors. The 128 entries of predictive residual codevectors are acquired beforehand by carrying out the above-described series of processes until a quantization target is calculated on speech signals in many processing frames, obtaining many predictive residual vectors, applying an LBG algorithm to the many predictive residual vectors obtained, extracting 128 entries of typical samples of predictive residual vectors and applying a generalization Lloyd algorithm disclosed in the aforementioned Document 8, etc., to the 128 entries of typical vectors extracted.

The first stage distortion calculation section 306 calculates a weighted Euclidean distortion between a target vector ($X_k[i]$, i=1, . . . , N) of the first stage vector quantizer supplied from the predictive residual calculation section 304 and a vector ($MA_k[0][i]*C_m[i]$, i=1, . . . , N) obtained by multiplying the predictive residual codevector ($C_m[i]$, i=1, . . . , N) with index m read from the first stage codebook 305 by the current processing frame component ($MA_k[0][i]$, i=1, . . . , N) of the MA predictive coefficient according to Expression (6) and outputs the calculated distortion value to the first stage VQ pre-selection section 307. By the way, the weighted Euclidean distortion is calculated by the first stage distortion calculation section 306 in the same way as for Embodiment 2 in that the calculation is performed on all combinations (512=128×4) of 4 sets (k=1, . . . , 4) of MA predictive coefficients used to generate 128 entries (m=1, . . . , 128) of predictive residual codevectors ($C_m[i]$, i=1, . . . , N) stored in the first stage codebook 305 and target vectors ($X_k[i]$, i=1, ..., N) supplied from the predictive residual calculation section 304. Therefore, a total of 512 distortions $d_{k,m}$ (k=1, ..., 4, m=1, ..., 128) are output from the first stage distortion calculation section 306 to the first stage VQ pre-selection section 307 in this embodiment, too.

The first stage VQ pre-selection section 307 compares aforementiontioned 512 distortions $d_{k,m}$ (k=1, ..., 4, m=1, ..., 128) supplied from the first stage distortion calculation section 306, selects N1 types of combination information of k (to which third-order predictive coefficient set of the 4 sets of third-order MA predictive coefficients corresponds)and m (to which codevector of the 128 entries of codevectors in the first stage codebook 305 corresponds), and records the selected k and m into N1cand_k[j] and N1cand_m[j] respectively, and outputs the recorded N1cand_k[j] and N1cand_m[j] (j=1, ..., N1) to the first stage VQ residual calculation section 308, predictive residual decoding section 315 and decoded LSF generation section 316. Furthermore, according to this embodiment, the first stage VQ pre-selection section 307 also outputs N1cand_m[j] (j=1, ..., N1) to the lower frequency scaling factor codebook 350 and higher frequency scaling factor codebook 360.

The first stage VQ residual calculation section 308 calculates N1 first stage VQ residual vectors $X_j^{(2)}[i]$ (i=1, ..., N, j=1, ..., N1) that remain after carrying out pre-selection processing using third-order predictive coefficient set (read from the predictive coefficient codebook 302) corresponding to information on N1 combinations of N1cand_k[j] and N1cand_m[j] (j=1, ..., N1) supplied from the first stage VQ pre-selection section 307 and codevectors (read from the first stage codebook 305) in the first stage codebook according to Expression (7) and outputs the calculated N1 vectors to the second stage lower frequency distortion calculation section 310 and second stage higher frequency distortion calculation section 311.

By the way, as in the case of Embodiment 2, suppose the second stage vector quantizer of this embodiment also has a split structure, decomposing (splitting) the first stage VQ residual vector into a lower frequency components (i=1, ..., NL) and higher frequency components (i=NL+1, ..., N) and vector-quantizing the respective vectors separately.

Therefore, $X_j^{(2)}[i]$ (i=1, ..., N, j=1, ..., N1) calculated by the first stage VQ residual vector calculation section 308 is output to the second stage lower frequency distortion calculation section 310 and second stage higher frequency distortion calculation section 311 in accordance with the configuration of the second stage vector quantizer. More specifically, $X_j^{(2)}[i]$ (i=1, ..., NL, j=1, ..., N1) is output to the second stage lower frequency distortion calculation section 310 and $X_j^{(2)}[i]$ (i=NL+1, ..., N, j=1, ..., N1) is output to the second stage higher frequency distortion calculation section 311.

This is the explanation of the processing by the first stage vector quantizer of the 2-stage vector quantizer.

The vector quantization apparatus in FIG. 6 then performs the processing by the second stage vector quantizer of the 2-stage vector quantizer (processing corresponding to the second stage lower frequency codebook 309, lower frequency scaling factor codebook 350, second stage lower frequency distortion calculation section 310, second stage higher frequency distortion calculation section 311, higher frequency scaling factor codebook 360, second stage higher frequency codebook 312, second stage lower frequency codebook search section 313 and second stage higher frequency codebook search section 314). Thus, this embodiment will also explain the processing by the aforementioned second stage vector quantizer of the 2-stage vector quantizer in detail below.

By the way, suppose that the second stage lower frequency codebook 309 stores 64 entries of second stage lower frequency codevectors (C2L$_{m2L}$[i], i=1, ..., NL, m2L=1, ..., 64) and the second stage higher frequency codebook 312 stores 64 entries of second stage higher frequency codevectors (C2H$_{m2H}$[i], i=NL+1, ..., N, m2H=1, ..., 64).

Furthermore, the lower frequency scaling factor codebook 350 has the function of storing as many (128 entries in this embodiment) lower frequency scaling factors (SF_low[j], j=1, 2, ..., N1) as the predictive residual codevectors stored in the first stage codebook 305 and the function of outputting the lower frequency scaling factors (SF_low[N1cand_m[j]]) corresponding to N1cand_m[j] supplied from the first stage VQ pre-selection section 307 to the second stage lower frequency distortion calculation section 310 and predictive residual decoding section 315. Furthermore, the higher frequency scaling factor codebook 360 has the function of storing as many (128 entries in this embodiment) lower frequency scaling factors (SF_high[j], j=1, 2, ..., N1) as the predictive residual codevectors stored in the first stage codebook 305 and the function of outputting the lower frequency scaling factors (SF_high[N1cand_m[j]]) corresponding to N1cand_m[j] supplied from the first stage VQ pre-selection section 307 to the second stage higher frequency distortion calculation section 311 and the predictive residual decoding section 315. By the way, suppose that the lower frequency scaling factors (SF_low[j], j=1,2, ..., N1) and higher frequency scaling factors (SF_high[j], j=1,2, ..., N1) store values in the range 0.5 to 2.0 acquired beforehand by a training consisting of the LBG algorithm and the generalized Lloyd algorithm.

The second stage lower frequency distortion calculation section 310 calculates a weighted Euclidean distortion between the lower frequency component $X_j^{(2)}[i]$ (i=1, ..., NL, j=1, ..., N1) of the first stage VQ residual vector supplied from the first stage VQ residual calculation section 308 and a vector (MA$_{N1cand\_k[j]}$[0][i]*SF_low[N1cand_m[j]]*C2L$_{m2L}$[i], i=1, ..., NL) obtained by multiplying the second stage lower frequency codevector (C2L$_{m2L}$[i], i=1, ..., NL) with index m2L read from the second stage lower frequency codebook 309 by SF_low[N1cand_m[j]] supplied from the lower frequency scaling factor codebook 350 and the current processing frame component (MA$_{N1cand\_k[j]}$[0][i], i=1, ..., NL) of the MA predictive coefficient according to Expression (12) below and outputs the calculated distortion value $d_2L_{j,m2L}$ to the second stage lower frequency codebook search section 313.

$$d2L_{j,m2L} = \sum_{i=1}^{NL} \{w[i] * (X_j^{(2)}[i] - \\ MA_{N1cand\_k[j]}[0][i] * \\ SF_{low}[N1cand\_m[j]] * C2L_{m2L}[i])\}^2,$$

$$j = 1, \cdots, N1, m2L = 1, \cdots, 64$$

Expression (12)

where w[i] in Expression (12) is the same "weight" as that in Expression (6).

By the way, suppose that the second stage lower frequency distortion calculation section 310 carries out distortion calculation according to Expression (12) above on the 64 entries of codevectors stored in the second stage lower frequency codebook 309 for each of N1 pieces of j specified by the first stage VQ pre-selection section 307 and outputs all the calculated weighted Euclidean distortions d2L$_{j,m2L}$(j=1, ..., N1, m2L=1, ..., 64) to the second stage lower frequency codebook search section 313 (a total of N1*64 d2L$_{j,m2L}$ are output).

The second stage higher frequency distortion calculation section 311 calculates a weighted Euclidean distortion between a higher frequency component X$_j^{(2)}$[i] (i=NL+1, ..., N, j=1, ..., N1) of the first stage VQ residual vectors supplied from the first stage VQ residual calculation section 308 and a vector (MA$_{N1cand\_k[j]}$[0][i]*SF_high[N1cand_m[j]]*C2H$_{m2H}$[i], i=NL+1, ..., N) obtained by multiplying the second stage higher frequency codevector (C2H$_{m2H}$[i], i=NL+1, ..., N) with index m2H read from the second stage higher frequency codebook 312 by SF_high[N1cand_m[j]] supplied from the higher frequency scaling factor codebook 360 and the current processing frame component (MA$_{N1cand\_k[j]}$[0][i], i=NL+1, ..., N) of the MA predictive coefficient according to Expression (13) below and outputs the calculated distortion value d2H$_{j,m2H}$ to the second stage higher frequency codebook search section 314.

$$d2H_{j,m2L} = \sum_{i=NL+1}^{NL} \{w[i] * (X_j^{(2)}[i] - MA_{N1cand\_k[j]}[0][i] * SF_{high}[N1cand\_m[j]] * C2H_{m2H}[i])\}^2,$$

$$j = 1, \cdots, N1, m2H = 1, \cdots, 64$$

Expression (13)

where w[i] in Expression (13) is the same "weight" as that in Expression (6).

By the way, suppose that the second stage higher frequency distortion calculation section 311 carries out distortion calculation according to Expression (13) above on the 64 entries of codevectors stored in the second stage higher frequency codebook 309 for each of N1 pieces of j specified by the first stage VQ pre-selection section 307 and outputs all the calculated weighted Euclidean distortions d2H$_{j,m2H}$ (j=1, ..., N1, m2H=1, ..., 64) to the second stage higher frequency codebook search section 313 (a total of N1*64 d2H$_{j,m2H}$ are output).

The second stage lower frequency codebook search section 313 specifies one index m2L that minimizes the distortion for each j for the weighted Euclidean distortion d2L$_{j,m2L}$ (j=1, ..., N1, m2L=1, ..., 64) supplied from the second stage lower frequency distortion calculation section 310, records the specified N1 (j=1, ..., N1) indices in N2Lcand[j] (j=1, ..., N1) and outputs the recorded N1 pieces of N2Lcand[j] (j=1, ..., N1) to the predictive residual decoding section 315.

The second stage higher frequency codebook search section 314 specifies one index m2H that minimizes the distortion for each j for the weighted Euclidean distortion d2H$_{j,m2H}$ (j=1, ..., N1, m2H=1, ..., 64) supplied from the second stage lower frequency distortion calculation section 310, records the specified N1 (j=1, ..., N1) indices in N2Hcand[j] (j=1, ..., N1) and outputs the recorded N1 pieces of N2Hcand[j] (j=1, ..., N1) to the predictive residual decoding section 315.

This is the explanation of the processing by the second stage vector quantizer of the second stage vector quantizer. By the way, by the time the processing by the above-described second stage vector quantizer is completed, N1 (j=1, ..., N1) pieces of combination information with the following four information items have been supplied to the predictive residual decoding section 315.

(1) N1cand_k[j]: Which of 4 sets of MA predictive coefficients is preliminarily selected (2) N1cand_m[j]: Which of 128 entries of first stage codevectors is preliminarily selected (3) N2Lcand[j]: Which of 64 entries of second stage lower frequency codevectors is preliminarily selected (4) N2Hcand[j]: Which of 64 entries of second stage higher frequency codevectors is preliminarily selected The following explanations of this embodiment will give details of the processing of specifying the combination number of information on combinations of information that minimizes CD from among N1 pieces of combination information supplied to the predictive residual decoding section 315 (processing corresponding to the predictive residual decoding section 315, decoded LSF generation section 316, LSF/LPC coefficient conversion sections 317 and 319, LPC coefficient/LPC cepstrum conversion sections 318 and 320 and LPC code final search section 321).

The predictive residual decoding section 315 reads the first stage codevector C$_{N1cand\_m[j]}$, lower frequency scaling factor SF_low[N1cand_m[j]] and higher frequency scaling factor SF_high[N1cand_m[j]] from the first stage codebook 305, lower frequency scaling factor codebook 350 and higher frequency scaling factor codebook 360, respectively, based on the supplied index information N1cand_m[j] and further reads the second stage lower frequency codevector C2L$_{N2Lcand[j]}$ from the second stage lower frequency codebook 309 based on the supplied index information N2Lcand[j], further reads the second stage higher frequency codevector C2H$_{N2Hcand[j]}$ from the second stage higher frequency codebook 312 based on the supplied index information N2Hcand[j], and calculates N1 (J=1, ..., N1) decoded predictive residual vectors Cq$_j$[i] (i=1, ..., N) according to Expression (14) using those codevectors, records/retains the calculated decoded predictive residual vectors and outputs them to the decoded LSF generation section 316.

$$Cq_j[i] = C_{N1cand\_m[j]}[i] + SF_{low}[N1cand\_m[j]] \\ * C2L_{N2Lcand[j]}[i] + SF_{high}[N1cand\_m[j]] \\ * C2H_{N2Hcand[j]}[i], j=1, \ldots, N1, i=1, \ldots, N$$

Expression (14)

where in Expression (14), C2L$_{N2Lcand[j]}$[i]=0.0 (i=NL+1, ..., N), C2H$_{N2Hcand[j]}$[i]=0.0 (i=1, ..., NL).

The predictive residual decoding section 315 also outputs N1cand_k[j] (j=1=1, ..., N1) to the decoded LSF generation section 316.

The decoded LSF generation section 316 reads MA$_{N1cand\_k[j]}$[0][i] corresponding to N1cand_k[j] (j=1, ..., N1) supplied from the predictive residual decoding section 315 from the predictive coefficient codebook 302, calculates N1 (j=1, ..., N1) decoded LSF parameters (hereinafter referred to as "LSFq$_j$[i], j=1, ..., N1, i=1, ..., N") according to Expression (10) using the read MA$_{N1cand\_k[j]}$[0][i], average LSF parameter AV[i] (i=1, ..., N) read from the average LSF storage section 323, X$_{N1cand\_k[j]}$[i] corresponding to N1cand_k[j] of the quantization target vector supplied from the predictive residual calculation section 304 and Cq$_j$[i] (i=1, ..., N) supplied from the predictive residual decoding section 315 and outputs the calculated decoded LSF parameters to the LSF/LPC coefficient conversion section 317.

The LSF/LPC coefficient conversion section 317 converts N1 (j=1, ..., N1) decoded LSF parameters (LSFq$_j$[i], j=1, ..., N1, i=1, ..., N) supplied from the decoded LSF generation section 316 to decoded LPC coefficients (hereinafter referred to as "LPCq$_j$[i], j=1, ..., N1, i=1, ..., N") and outputs the decoded LPC coefficients to the LPC coefficient/LPC cepstrum conversion section 318.

As in the case of Embodiment 2, the LPC coefficient/LPC cepstrum conversion section 318 converts N1 (j=1, ..., N1) decoded LPC coefficients (LPCq$_j$[i], i=1, ..., N) supplied from the LSF/LPC coefficient conversion section 317 to decoded LPC cepstra (hereinafter referred to as "QCEP$_j$[i], i=1, ..., Nc, j=1, ..., N1") and outputs the decoded LPC cepstra to the LPC code final search section 321.

The LSF/LPC coefficient conversion section 319 converts the LSF parameters to LPC coefficients and outputs the LPC coefficients to the LPC coefficient/LPC cepstrum conversion section 320. The LPC coefficient/LPC cepstrum conversion section 320 converts the LPC coefficients supplied from the LSF/LPC coefficient conversion section 319 to LPC cepstra (hereinafter referred to as "CEP$_t$[i], i=1, ..., Nc") and outputs the LPC cepstra to the LPC code final search section 321.

The LPC code final search section 321 first calculates distortions DIS$_j$ (j=1, ..., N1) between the LPC cepstrum coefficients (CEP$_t$[i], i=1, ..., Nc) supplied from the LPC coefficient/LPC cepstrum conversion section 320 and N1 (j=1, ..., N1) decoded LPC cepstra (QCEP$_j$[i], i=1, ..., Nc, j=1, ..., N1) supplied from the LPC coefficient/LPC cepstrum conversion section 318 according to Expression (11), compares the sizes of the calculated N1 pieces of DIS$_j$, specifies one index "J" that minimizes DIS$_j$ and outputs 21-bit information combining the following four information items corresponding to the specified index "J", that is:

(1) N1cand_k[J]: Which of 4 sets of MA predictive coefficients is optimal (using 2 bits)

(2) N1cand_m[J]: Which of 128 entries of first stage codevectors is optimal (using 7 bits)

(3) N2Lcand[J]: Which of 64 entries of second stage lower frequency codevectors is optimal (using 6 bits)

(4) N2Hcand[J]: Which of 64 entries of second stage higher frequency codevectors is optimal (using 6 bits) as an LPC code of the relevant processing frame (code to express spectral envelope information on the processing frame section).

As in the case of Embodiment 2, the LPC code final search section 321 also supplies index J that minimizes DISj to the predictive residual decoding section 315.

Then, the predictive residual decoding section 315 selects vectors Cq$_j$[i] (i=1, ..., N) corresponding to the index J from among N1 (j=1, ..., N1) retained/stored decoded predictive residual vectors Cq$_j$[i] (i=1, ..., N) and outputs the vectors to the decoding predictive residual storage section 322.

The decoding predictive residual storage section 322 discards the oldest decoded predictive residual vector out of the decoded predictive residual vectors corresponding to a plurality of past stored frames (the decoded predictive residual vectors corresponding to the past 3 frames are stored because this embodiment carries out third-order MA prediction) and newly retains Cq$_j$[i] (i=1, ..., N) newly supplied from the predictive residual decoding section 315 for MA prediction in the next processing frame.

The explanation so far describes the content of the series of processes after LSF parameters are input to the vector quantization apparatus until LPC codes are output.

On the other hand, the decoder for LSF parameters output from the vector quantization apparatus (also the decoder for LPC coefficients obtained by converting the LSF parameters) can be constructed of a step of decomposing an LPC code into four pieces of index information (N1cand_k[J], N1cand_m [J], N2Lcand[J] and N2Hcand[J]), a step of calculating decoded predictive residual vectors based on each piece of index information obtained in the step of decomposing an LPC code and a step of generating decoded LSF vectors based on the decoded predictive residual vectors obtained in the step of calculating decoded predictive residual vectors. More specifically, in the step of decomposing an LPC code, an LPC code is decomposed into four pieces of index information (N1cand_k[J], N1cand_m[J], N2Lcand[J] and N2Hcand[J]) first. Then, in the step of calculating decoded predictive residual vectors, by reading first stage codevector $C_{N1cand\_m[J]}$, lower frequency scaling factor SF_low [N1cand_m[j]] and higher frequency scaling factor SF_high [N1cand_m[j]] from the first stage codebook 305, lower frequency scaling factor codebook 350 and higher frequency scaling factor codebook 360 based on index information N1cand_m[J], then reading the second stage lower frequency codevector $C2L_{N2Lcand[J]}$ from the second stage lower frequency codebook 309 based on index information N2Lcand [J], further reading the second stage higher frequency codevector $C2H_{N2Hcand[J]}$ from the second stage higher frequency codebook 312 based on the index information N2Hcand[J] and using 3 entries of vector and 2 entries of scaling factors read to carry out sum of products processing according to Expression (14), it is possible to acquire decoded predictive residual vector Cq$_j$[i] (i=1, ..., N) corresponding to the LPC code. Then, in the step of generating a decoded LSF vector, by reading $MA_{N1cand\_k[J]}[0][i]$ corresponding to index information N1cand_k[J] from the predictive coefficient codebook 302, and according to Expression (10) using the read $MA_{N1cand\_k[J]}[0][i]$, average LSF parameter AV[i] (i=1, ..., N) read from the average LSF storage section 323, $X_{N1cand\_k[J]}$ corresponding to N1cand_k[j] of the quantization target vector supplied from the predictive residual calculation section 304 and Cq$_j$[i] (i=1, ..., N) supplied from the predictive residual decoding section 315, it is possible to obtain final decoded LSF parameter (hereinafter referred to as "LSFq$_j$[i], i=1, ..., N"). By the way, when the decoded LSF parameter is further converted to a decoded LPC coefficient, it is possible to further provide a step having the same function as that of the LSF/LPC coefficient conversion section 317 after the step of generating the decoded LSF vector.

According to the vector quantization apparatus having a 2-stage split structure using third-order MA prediction further equipped with the lower frequency scaling factor codebook 350 and higher frequency scaling factor codebook 360 explained in detail above, it is possible to adapt the contribution of the second stage codevector in the whole decoding vector to the codevector $C_{N1cand\_m[J]}$ (actually index N1cand_m[j] corresponding to codevector $C_{N1cand\_m[J]}$) selected in the first stage vector quantization processing and control it, and thereby reduce quantization distortion, carry out pre-selection of a code using the weighted Euclidean distortion as a measure and select an optimum code using CD (Cepstram Distortion) as a reference measure for the remaining candidates after the pre-selection, which makes it possible to vector-quantize LSF parameters with high accuracy compared to the conventional vector quantization apparatus.

By the way, according to the vector quantization apparatus of this embodiment as in the case of Embodiment 2, it is possible to freely control the increment in the amount of calculation required for an LPC codebook search by controlling the number of codevectors to be preliminarily selected by the first stage VQ pre-selection section 307. That is, this embodiment makes it possible to improve the performance of the vector quantizer while considering the increment in the amount of calculation required for an LPC codebook search.

Furthermore, this embodiment has described the case where the number of candidates N1 of codevectors left by the first stage VQ pre-selection section 307 (N1 is often determined to values such as 8, 16, 32 and 64 through experiments or empirically), but it is also possible to use other pre-selection methods such as setting a threshold for the weighted Euclidean distortion and leaving candidates whose weighted Euclidean distortion is smaller than the set threshold as the candidates after the pre-selection and similar effect/operation can be obtained in this case, too.

Furthermore, this embodiment has described the case where the first stage VQ pre-selection section 307 preliminarily selects codevectors using the weighted Euclidean distortion in Expression (2) as a measure, but this embodiment can also be implemented when a weighted Euclidean distortion according to expressions different from Expressions (8) and (10) in the aforementioned Document 4 is used, and an effect/operation similar to those of this embodiment can be obtained in this case, too.

By the way, with respect to "weight" of the weighted Euclidean distortion, various calculation methods have been proposed so far (e.g., a method of carrying out weighting according to a distortion between neighboring elements of LSF parameters described in Document 5 or a method of carrying out weighting according to a power spectrum of a quantization target described in Document 6), but the present invention is applicable irrespective of the "weight" calculation method and a similar effect/operation can be obtained in this case, too.

Furthermore, this embodiment has described the case where input vectors are LSF parameters, but this embodiment is also applicable to a case where other parameters expressing short-time spectral envelope information of a speech signal such as LSP parameter, PARCOR coefficient and LPC coefficient are vector-quantized and a similar effect/operation can be obtained in this case, too.

Furthermore, this embodiment has described the case where the LPC code final search section 321 specifies a final LPC code using CD (Cepstral Distortion) as a measure, but it is also possible to replace the LPC coefficient/LPC cepstrum conversion sections 318 and 320 with an LPC coefficient/FFT power spectrum calculation section having the function of calculating an FFT power spectrum from LPC coefficients and further change the calculation expression used by the LPC code final search section 321 from Expression (11) to the calculation expression in the square root portion in Expression (4) to use SD (Spectral Distortion) as the final measure of the LPC code search section and a similar effect/operation can be obtained in this case, too.

Furthermore, this embodiment has described the vector quantizer having a specific structure called "2-stage split structure using third-order MA prediction accompanied by scaling factors" as an example, but this embodiment is also applicable to an LPC parameter vector quantization apparatus having a structure other than this example and a similar effect/operation can be obtained in this case, too.

The above-described embodiment is preferably applicable to coding/decoding of short-time spectral envelope information on speech signals of a speech coder/decoder based on a CELP system or Vocoder system.

Embodiment 4

Figure 7:
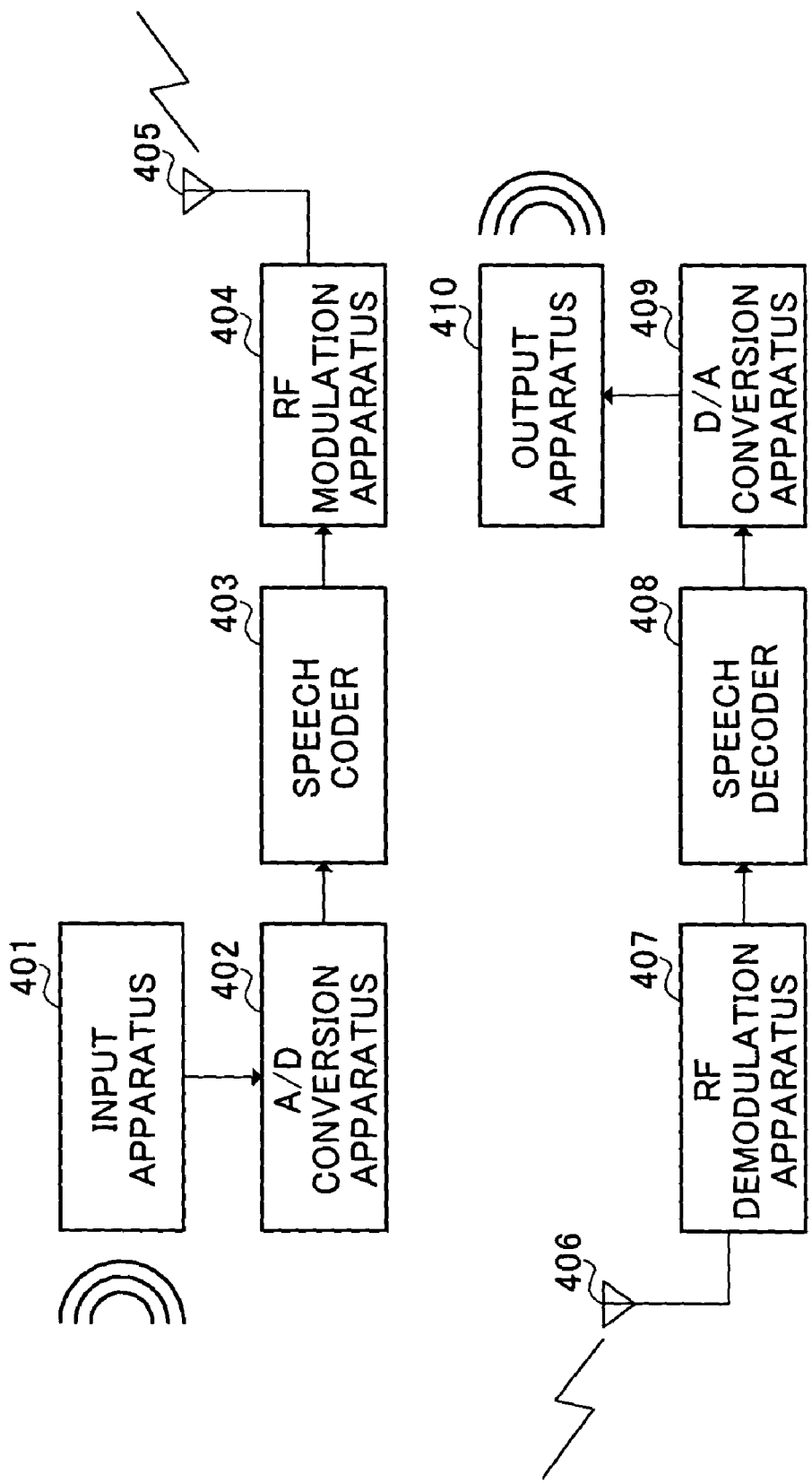
FIG. 7 is a block diagram showing a configuration of a speech signal transmission apparatus and speech signal reception apparatus according to Embodiment 4 of the present invention.

FIG. 7 is a block diagram showing a configuration of a speech signal transmission apparatus and reception apparatus according to Embodiment 4 of present invention. In FIG. 7, a speech signal is converted to an electric signal by an input apparatus 401 of the transmission apparatus and output to an A/D conversion apparatus 402. The A/D conversion apparatus 402 converts the (analog) speech signal output from the input apparatus 401 to a digital signal and outputs the signal to a speech coder 403.

The speech coder 403 codes the digital speech signal output from the A/D conversion apparatus 402 using a speech coding method, which will be described later, and outputs the coded information to an RF modulation apparatus 404. The RF modulation apparatus 404 converts the speech coded information output from the speech coder 403 to a signal to be carried on a propagation medium such as a radio frequency band and outputs the signal to a transmission antenna 405. The transmission antenna 405 sends the output signal output from the RF modulation apparatus 404 as a radio signal (RF signal).

The RF signal sent from the transmission apparatus is received by a reception antenna 406 of the reception apparatus and output to an RF demodulation apparatus 407. The RF demodulation apparatus 407 demodulates speech coded information from the RF signal output from the reception antenna 406 and outputs it to the speech decoder 408.

The speech decoder 408 decodes the speech signal according to a speech decoding method, which will be described later, using the speech coded information output from the RF demodulation apparatus 407 and outputs it to a D/A conversion apparatus 409. The D/A conversion apparatus 409 converts the digital speech signal output from the speech decoder 408 to an analog electric signal and outputs it to an output apparatus 410. The output apparatus 410 converts the electric signal to air vibration and outputs it as sound wave audible to human ears.

By providing at least one of the speech signal transmission apparatus and reception apparatus in the above-described configuration, it is possible to construct a base station apparatus and communication terminal apparatus in a mobile communication system.

Figure 8:
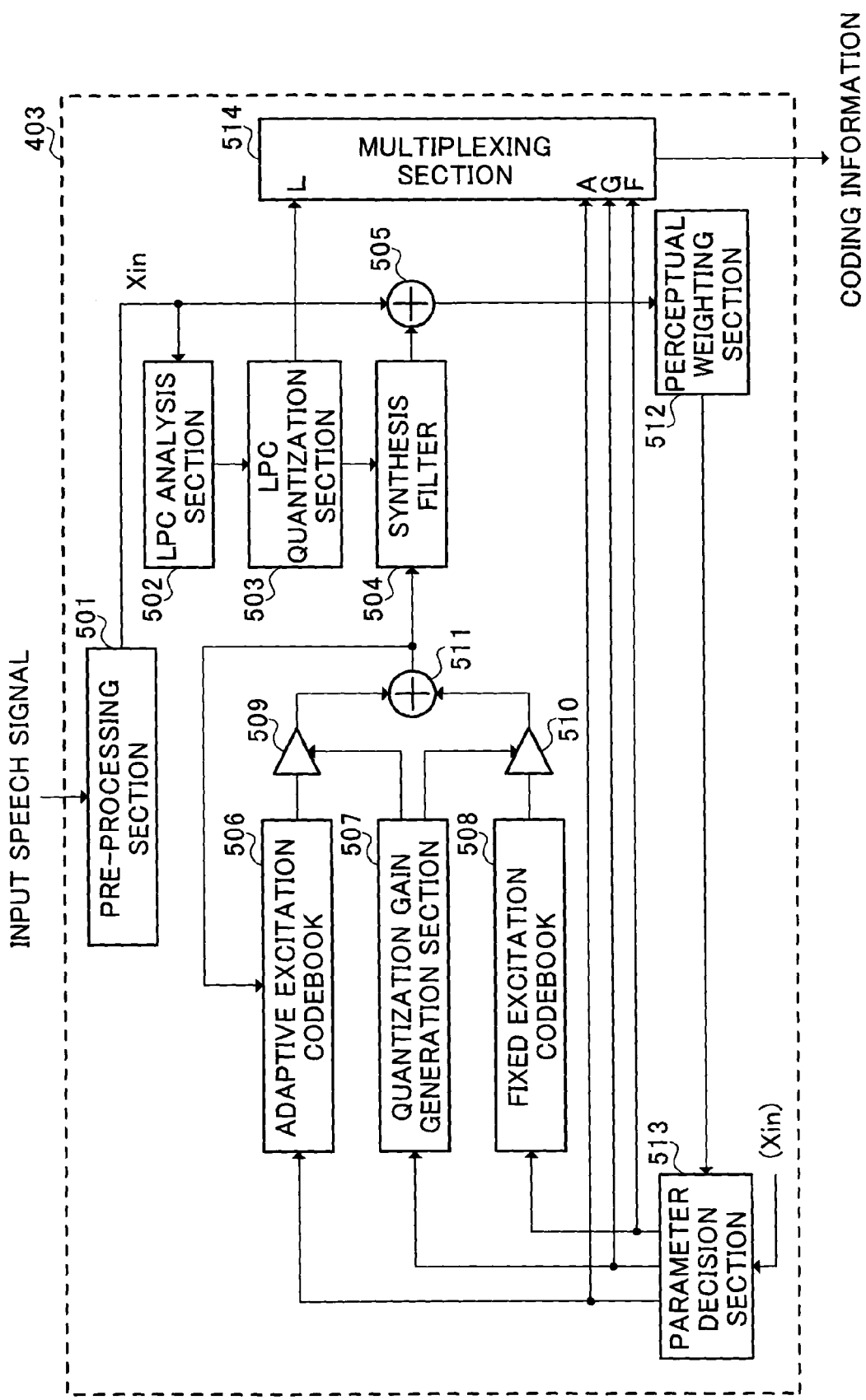
FIG. 8 is a block diagram showing a configuration of a speech coder according to Embodiment 4 of the present invention.

The above-described speech signal transmission apparatus is characterized by the speech coder 403. FIG. 8 is a block diagram showing a configuration of the speech coder 403. In FIG. 8, an input speech signal is the signal output from the A/D conversion apparatus 402 in FIG. 7 and input to a pre-processing section 501. The pre-processing section 501 carries out high pass filter processing for removing a DC component, waveform shaping processing and pre-emphasis processing which will lead to a performance improvement of the subsequent coding processing on the input speech signal and outputs the processed signal to an LPC analysis section 502, an adder 505 and a parameter decision section 513 (Xin).

The LPC analysis section 502 carries out a linear predictive analysis using Xin and outputs the result (LPC vector/LPC coefficients) to an LPC quantization section 503. The LPC quantization section 503 converts the LPC vector output from the LPC analysis section 502 to an LSF parameter and vector-quantizes the LSF vector obtained through the conversion using the method shown in Embodiments 1, 2 and 3 and outputs the LPC code (L) obtained by vector quantization to a multiplexing section 514.

The LPC quantization section 503 further obtains decoded LPC vector in the LSF domain using the LPC vector decoding method shown in Embodiments 1, 2 and 3, converts the decoded LPC(LSF) vector obtained to decoded LPC coefficients and outputs the decoded LPC coefficients obtained by the conversion to a synthesis filter 504.

The synthesis filter 504 carries out a filter synthesis using the decoded LPC coefficients and an excitation vector output from an adder 511 and outputs the synthesis signal to the adder 505. The adder 505 calculates an error signal between Xin and the synthesis signal and outputs the error signal to a perceptual weighting section 512.

The perceptual weighting section 512 carries out perceptual weighting on the error signal output from the adder 505, calculates distortion between Xin and the synthesis signal in the perceptual weighted domain and outputs it to the parameter decision section 513. The parameter decision section 513 decides the signal to be generated from an adaptive excitation codebook 506, a fixed excitation codebook 508 and quantization gain generation section 507 so that the coding distortion output from the perceptual weighting section 512 is minimized.

By the way, it is also possible to further improve the coding performance not only by minimizing the coding distortion output from the perceptual weighting section 512 but also by deciding the signal to be generated from the three means using another coding distortion using Xin.

The adaptive excitation codebook 506 buffers excitation signals output in the past from the adder 511, extracts adaptive excitation vectors from the position specified by a signal (A) output from the parameter decision section 513 and outputs them to a multiplier 509. The fixed excitation codebook 508 outputs vectors having a shape specified by a signal (F) output from the parameter decision section 513 to a multiplier 510.

The quantization gain generation section 507 outputs the adaptive excitation gain and fixed excitation gain specified by a signal (G) output from the parameter decision section 513 to the multipliers 509 and 510 respectively.

The multiplier 509 multiplies the adaptive excitation vector output from the adaptive excitation codebook 506 by the quantization adaptive excitation gain output from the quantization gain generation section 507 and outputs the multiplication result to the adder 511. The multiplier 510 multiplies the fixed excitation gain output from the fixed excitation codebook 508 by the fixed excitation vector output from the quantization gain generation section 507 and outputs the multiplication result to the adder 511.

The adder 511 inputs the adaptive excitation vector and fixed excitation vector after the gain multiplication from the multipliers 509 and 510 respectively, carries out a vector addition and outputs the addition result to the synthesis filter 504 and the adaptive excitation codebook 506.

Finally, the multiplexing section 514 inputs a code L representing a quantization LPC from the LPC quantization section 503, inputs a code A representing an adaptive excitation vector, a code F representing a fixed excitation vector and a code G representing a quantization gain from the parameter decision section 513 and multiplexes these pieces of information and outputs the multiplexed information as coded information to a transmission path.

Figure 9:
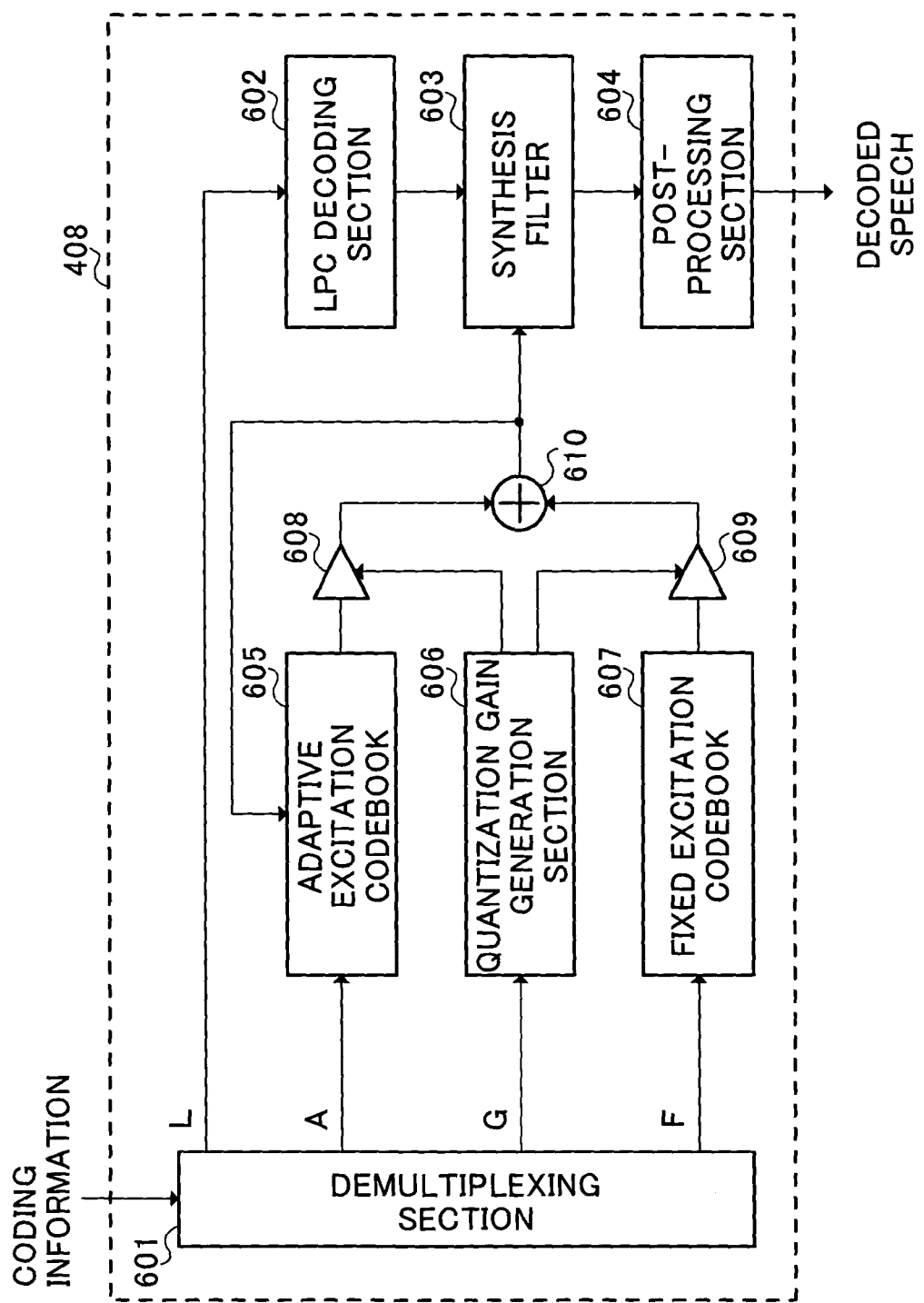
FIG. 9 is a block diagram showing a configuration of a speech decoder according to Embodiment 4 of the present invention.

FIG. 9 is a block diagram showing a configuration of the speech decoder 408 in FIG. 7. In FIG. 9, the multiplexed coded information output from the RF demodulation section 407 is demultiplexed into individual coded information pieces by a demultiplexing section 601.

A demultiplexed LPC code L is output to an LPC decoding section 602, a demultiplexed adaptive excitation vector code A is output to an adaptive excitation codebook 605, a demultiplexed excitation gain code G is output to a quantization gain generation section 606 and a demultiplexed fixed excitation vector code F is output to a fixed excitation codebook 607.

An LPC decoding section 602 acquires a decoded LPC vector from the code L (which means the LPC code in Embodiments 1, 2 and 3) output from the demultiplexing section 601 using the decoded LPC vector generation method shown in Embodiments 1, 2 and 3, converts the acquired decoded LPC vector to decoded LPC coefficients and outputs the decoded LPC coefficients obtained by the conversion to a synthesis filter 603.

The adaptive excitation codebook 605 extracts an adaptive excitation vector from a position specified by the code A output from the demultiplexing section 601 and outputs it to a multiplier 608. The fixed excitation codebook 607 generates a fixed excitation vector specified by the code F output from the demultiplexing section 601 and outputs it to a multiplier 609.

The quantization gain generation section 606 decodes the adaptive excitation vector gain and fixed excitation vector gain specified by the excitation gain code G output from the demultiplexing section 601 and outputs the gains to multipliers 608 and 609 respectively. The multiplier 608 multiplies the adaptive codevector by the adaptive codevector gain and outputs the multiplication result to an adder 610. The multiplier 609 multiplies the fixed codevector by the fixed codevector gain and outputs the multiplication result to the adder 610.

The adder 610 adds up the adaptive excitation vector and the fixed excitation vector after the gain multiplication output from the multipliers 608 and 609 and outputs the addition result to the synthesis filter 603. The synthesis filter 603 carries out a filter synthesis using the excitation vector output from the adder 610 as a sound source signal and a synthesis filter constructed with the decoded LPC coefficients supplied from the LPC decoding section 602 as the filter coefficient, and outputs the synthesized signal to a post-processing section 604.

The post-processing section 604 carries out processing of improving subjective speech quality such as formant emphasis and/or pitch emphasis, and processing of improving subjective speech quality of stationary noise segments, etc., and outputs the processed signal as a final decoded speech signal.

Thus, applying the LPC vector quantization apparatus according to the present invention to a speech coder/decoder makes it possible to obtain synthesized speech of higher quality than that of a speech coder/decoder using a conventional vector quantization apparatus.

Furthermore, the above-described speech coder/decoder is also applicable to a communication apparatus such as a base station apparatus and mobile station in a digital radio communication system. This makes it possible to obtain synthesized speech of higher quality than that using a conventional vector quantization apparatus in a digital radio communication system.

The present invention is not limited to Embodiments 1 to 3 above, but can be implemented modified in various ways. For example, the vector quantization/decoding of an LPC vector according to Embodiments 1, 2 and 3 has been explained as a vector quantization apparatus or speech coder/speech decoder, but vector quantization/decoding of an LPC vector can also be implemented by software. For example, it is possible to store the above-described LPC vector quantization/decoding program in a ROM and execute the program according to instructions from a CPU. Furthermore, it is possible to store an LPC vector quantization/decoding program in a computer-readable storage medium, record the LPC parameter vector quantization/decoding program of this storage medium in a RAM of a computer and operate it according to the vector quantization program. An operation/effect similar to those of Embodiments 1, 2 and 3 above can also be obtained in this case, too.

As is apparent from the above-described explanations, when LPC parameters representing short-time spectral envelope information of a speech signal are vector-quantized, the present invention can preliminarily select a small number of codevectors using a (weighted) Euclidean distortion as a measure, carry out a codebook search (specification of a final LPC code) using an amount of distortion of a spectral space such as CD (Cepstram Distortion) or SD (Spectral Distortion) as a reference measure, and consequently provide a vector quantizer with higher performance than the conventional vector quantization apparatus using only a (weighted) Euclidean distortion as a reference measure for a codebook search (distortion in a spectral space such as CD and SD is smaller than the conventional one).

Furthermore, applying the LPC vector quantization apparatus according to the present invention to a speech coder/decoder makes it possible to obtain synthesized speech of higher quality than that of a speech coder/decoder using a conventional vector quantization apparatus.

This application is based on the Japanese Patent Application No.2000-366191 filed on Nov. 30, 2000, entire content of which is expressly incorporated by reference herein.

INDUSTRIAL APPLICABILITY

The present invention is preferably applicable to a speech coder/decoder used to enhance the speech signal transmission efficiency in the fields of a packet communication system represented by Internet communication and a mobile communication system, etc.

What is claimed is:

1. An LPC parameter vector quantization apparatus comprising:
   a distortion calculator that calculates distortion between a plurality of codevectors successively read from an LSF codebook storing a plurality of LSF codevectors and a target quantization using a first distortion evaluation measure;
   an LPC code pre-selector that preliminarily selects indices of codevectors that reduce the amount of distortion according to said first distortion evaluation measure, from said plurality of LSF codevectors, and that generates decoded LSF parameters corresponding to the respective preliminarily selected indices;
   a first parameter convertor that converts said decoded LSF parameters to first distortion calculation parameters, respectively, with which distance of a spectrum can be calculated;
   a second parameter convertor that converts an LSF parameter comprising said quantization target to a second distortion calculation parameter with which distance of a spectrum can be calculated; and
   an LPC code final searcher that calculates distortion between said second distortion calculation parameter, obtained by converting said quantization target and supplied from said second parameter convertor, and said first distortion calculation parameters, obtained by converting said decoded LSF parameters and supplied from said first parameter convertor, using a second distortion evaluation measure that is different from said first distortion evaluation measure, and that outputs, as an LPC code, an index of an LSF codevector corresponding to said first distortion calculation parameter that minimizes the amount of distortion according to said second distortion evaluation measure.

2. The LPC parameter vector quantization apparatus according to claim 1, wherein the first distortion evaluation measure is a Euclidean distortion.

3. The LPC parameter vector quantization apparatus according to claim 1, wherein the first distortion evaluation measure is a weighted Euclidean distortion.

4. The LPC parameter vector quantization apparatus according to claim 1, wherein the second distortion evaluation measure is cepstrum distortion (CD).

5. The LPC parameter vector quantization apparatus according to claim 1, wherein the second distortion evaluation measure is spectrum distortion (SD).

6. The LPC parameter vector quantization apparatus according to claim 1 that carries out predictive vector quantization.

7. The LPC parameter vector quantization apparatus according to claim 1 that carries out split vector quantization.

8. The LPC parameter vector quantization apparatus according to claim 1 that carries out predictive vector quantization and split vector quantization.

9. An LPC parameter decoder comprising:
   an input that inputs an LPC code output by the vector quantization apparatus according to claim 1; and
   a reader section that reads an arbitrary codevector from the same codebook as the LSF codebook of said vector quantization apparatus,
   wherein the codevector corresponding to said LPC code is read from said codebook and the read codevector is output as a decoded LPC parameter.

10. A speech decoder comprising:
    a parameter decoder that decodes parameters representing spectrum characteristics encoded by a speech coder, using the LPC parameter decoder according to claim 9;
    a fixed excitation codebook;
    an adaptive excitation codebook that represents a cyclic component of a synthesized speech signal; and
    an excitation vector decoder that decodes excitation vectors determined by said speech coder from said fixed excitation codebook and said adaptive excitation codebook and synthesizes a synthesized speech signal from the decoded excitation vector and said parameters.

11. A speech signal reception apparatus that is equipped with a speech decoder, comprising:
    a decoder that decodes parameters representing spectrum characteristics encoded by a speech coder, using the LPC parameter decoder according to claim 9;
    a fixed excitation codebook;
    an adaptive excitation codebook that represents a cyclic component of a synthesized speech signal; and
    an excitation vector decoder that decodes excitation vectors determined by said speech coder from said fixed excitation codebook and said adaptive excitation codebook and synthesizes a synthesized speech signal from the decoded excitation vector and said parameters.

12. A speech coder comprising:
    a section that quantizes/encodes spectrum characteristics of an input speech signal, using the LPC parameter vector quantization apparatus according to claim 1;
    an adaptive excitation codebook that represents a cyclic component of an input speech signal;
    a fixed excitation codebook;
    a synthesizer that synthesizes a synthesized speech signal using excitation vectors generated from said fixed excitation codebook and said adaptive excitation codebook, and said parameters; and a determiner that determines outputs from said fixed codebook and said adaptive codebook to decrease distortion between an input speech signal and said synthesized speech signal.

13. A speech signal transmission apparatus that is equipped with a speech coder, comprising:
a section that quantizes/encodes spectrum characteristics of an input speech signal, using the LPC parameter vector quantization apparatus according to claim 1;
an adaptive excitation codebook that represents a cyclic component of an input speech signal;
a fixed excitation codebook;
a synthesizer that synthesizes a synthesized speech signal using excitation vectors generated from said fixed excitation codebook and said adaptive excitation codebook and said parameters; and
a determiner that determines outputs from said fixed codebook and said adaptive codebook to decrease distortion between an input speech signal and said synthesized speech signal.

14. An LPC parameter vector quantization apparatus comprising:
a Euclidean distortion calculator that calculates a Euclidean distortion between codevectors successively read from an LSF codebook storing a plurality of LSF codevectors and a quantization target;
an LPC code pre-selector that preliminarily selects codevector indices that reduce said Euclidean distortion and that generates decoded LSF parameters corresponding to the respective preliminarily selected indices;
a first LSF/LPC coefficient convertor that converts said decoded LSF parameters to the respective decoded LPC coefficients;
a first LPC coefficient/LPC cepstrum convertor that converts said decoded LPC coefficients to the respective LPC cepstra;
a second LSF/LPC coefficient converter that converts an LSF parameter comprising said quantization target to an LPC coefficient;
a second LPC coefficient/LPC cepstrum convertor that converts said LPC coefficient, obtained by converting said quantization target, to an LPC cepstrum;
an LPC code final searcher that calculates cepstrum distortion (CD) between LPC cepstra obtained by converting said quantization target and supplied from said first and second LPC coefficient/LPC cepstrum converters and the LPC cepstra obtained by converting said decoded LSF parameters, and that outputs, as an LPC code, the index of the LSF codevector corresponding to an LPC cepstrum that minimizes said cepstrum distortion.

15. An LPC parameter decoder comprising:
an input that inputs the LPC code output by the LSF parameter vector quantization apparatus according to claim 14; and
a reader that reads an arbitrary codevector from the same codebook as the codebook used for vector quantization, wherein the codevector corresponding to said input LPC code is read from said codebook and output as a decoded LPC parameter.

16. An LPC parameter vector quantization apparatus comprising:
a Euclidean distortion calculator that calculates a Euclidean distortion between codevectors successively read from an LSF codebook storing a plurality LSF codevectors and a quantization target;
an LPC code pre-searcher that preliminarily selects codevector indices that reduce said Euclidean distortion and that generates decoded LSF parameters corresponding to the respective preliminarily selected indices;
an LSF/LPC coefficient convertor that converts said decoded LSF parameters to their respective decoded LPC coefficients;
a first LPC coefficient/FFT power spectrum calculator that calculates FFT power spectra from said decoded LPC coefficients;
an LSF/LPC coefficient convertor that converts an LSF parameter comprising said quantization target to an LPC coefficient;
a second LPC coefficient/FFT power spectrum calculator that calculates an FFT power spectrum from said LPC coefficient obtained by converting said quantization target; and
an LPC code final searcher that calculates spectrum distortion (SD) between FFT power spectra obtained by converting said quantization target and supplied from said first and second LPC coefflcient/FFT power spectrum calculators and the FFT power spectra obtained by converting said decoded LSF parameters, and that outputs, as an LPC code, the LSF codevector index corresponding to an FFT power spectrum that minimizes said spectrum distortion.

17. An LSF parameter vector quantization apparatus having a two-stage split configuration that calculates a differential vector by differentiating a prestored average LSF parameter from an input LSF parameter, that calculates a predictive vector corresponding to said differential vector, that calculates a predictive residual vector by further differentiating said predictive vector from said differential vector, that vector- quantizes said predictive residual vector and outputs an LPC code, said quantization apparatus comprising:
a first stage vector quantization section that vector-quantizes said predictive residual vector using a plurality of predictive residual vectors stored in a first stage codebook and using a weighted Euclidean distortion as a distortion evaluation measure; and
a second stage vector quantization section that vector-quantizes a first stage VQ residual vector generated by said first stage vector quantization section using a plurality of first stage VQ residual vector lower frequency components stored in a second stage lower frequency codebook and first stage VQ residual vector higher frequency components stored in a second stage higher frequency codebook and using cepstrum distortion (CD) as a distortion evaluation measure.

18. An LSF parameter decoder that decomposes the LPC code output by the vector quantization apparatus according to claim 17 into index information, calculates a decoded predictive residual vector based on said index information and generates a decoded LSF parameter based on said decoded predictive residual vector, wherein said LSF parameter decoder is configured to read a first stage codevector corresponding to said index information, second stage lower frequency codevector and second stage higher frequency codevector from the respective codebooks, to add said three read codevectors and to generate a decoded predictive residual vector.

19. An LPC coefficient decoder that converts the decoded LSF parameter generated by the LSF parameter decoder according to claim 18 to a decoded LPC coefficient.

20. An LSF parameter vector quantization apparatus having a two-stage split configuration that calculates a differential vector by differentiating a prestored average LSF parameter from an input LSF parameter, that calculates a predictive vector corresponding to said differential vector, that calculates a predictive residual vector by further differentiating said predictive vector from said differential vector, vector-quantizes said predictive residual vector and that outputs an LPC code, said quantization apparatus compnsing:

- a first stage vector quantization section that vector-quantizes said predictive residual vector using a plurality of predictive residual vectors stored in a first stage codebook and using a weighted Euclidean distortion as a distortion evaluation measure; and
- a second stage vector quantization section that vector-quantizes a first stage VQ residual vector generated by said first stage vector quantization section using the same number of entries of lower frequency scaling factors as predictive residual vectors stored in a lower frequency scaling factor codebook, the same number of entries of higher frequency scaling factors as predictive residual vectors stored in the first stage codebook stored in a higher frequency scaling factor codebook and higher frequency codevectors stored in the second stage higher frequency codebook and using cepstrum distortion (CD) as a distortion evaluation measure.

21. An LSF parameter decoder that decomposes the LPC code output by the vector quantization apparatus according to claim 20 into index information, calculates a decoded predictive residual vector based on said index information and generates decoded LSF parameter based on said decoded predictive residual vector, wherein said LSF parameter decoder read is configured to a first stage codevector corresponding to said index information, second stage lower frequency codevector, second stage higher frequency codevector, lower frequency scaling factor and higher frequency scaling factor from the respective codebooks, to calculate a sum of products of said three read codevectors and two scaling factors and to generate a decoded predictive residual vector.

22. An LPC coefficient decoder that converts the decoded LSF parameter generated by the parameter decoder according to claim 21 to a decoded LPC coefficient.

* * * * *

UNITED STATES PATENT AND TRADEMARK OFFICE
CERTIFICATE OF CORRECTION

PATENT NO.         : 7,392,179 B2                                           Page 1 of 1
APPLICATION NO. : 10/416532
DATED                 : June 24, 2008
INVENTOR(S)        : Kazutoshi Yasunaga et al.

It is certified that error appears in the above-identified patent and that said Letters Patent is hereby corrected as shown below:

In column 34 line 19 please replace "coefflcient" with --coefficient--

Signed and Sealed this

Twenty-fourth Day of February, 2009

JOHN DOLL
*Acting Director of the United States Patent and Trademark Office*